(12) United States Patent  (10) Patent No.: US 11,522,095 B2
Irikawa  (45) Date of Patent: Dec. 6, 2022

(54) SOLAR CELL MODULE INCLUDING SOLAR CELLS, METHOD OF MANUFACTURING SOLAR CELL MODULE

(71) Applicant: PANASONIC CORPORATION, Osaka (JP)

(72) Inventor: Junpei Irikawa, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 22 days.

(21) Appl. No.: 17/003,889

(22) Filed: Aug. 26, 2020

(65) Prior Publication Data

US 2021/0066524 A1    Mar. 4, 2021

(30) Foreign Application Priority Data

Aug. 30, 2019  (JP) .............................. JP2019-158901

(51) Int. Cl.
*H01L 31/05* (2014.01)
*H01L 31/18* (2006.01)
*H01L 31/048* (2014.01)
*H01L 31/0352* (2006.01)

(52) U.S. Cl.
CPC .. *H01L 31/0512* (2013.01); *H01L 31/035281* (2013.01); *H01L 31/048* (2013.01); *H01L 31/188* (2013.01)

(58) Field of Classification Search
None
See application file for complete search history.

(56) References Cited

U.S. PATENT DOCUMENTS

| 2009/0272428 A1* | 11/2009 | Jansen | H01L 31/02013 136/251 |
| 2010/0288353 A1* | 11/2010 | Kliesch | H01L 31/0481 428/515 |
| 2011/0061735 A1* | 3/2011 | Nishijima | C08J 5/18 526/194 |
| 2011/0214738 A1* | 9/2011 | Halahmi | H01L 31/0543 522/120 |
| 2011/0300664 A1* | 12/2011 | Chung | H01L 31/0512 257/E31.117 |

(Continued)

FOREIGN PATENT DOCUMENTS

| CN | 208271927 U | † | 12/2018 |
| JP | 2018-530168 A |  | 10/2018 |

OTHER PUBLICATIONS

Pierre, Papet, et al., "Overlap modules: A unique cell layup using smart wire connection technology", pp. 080001-1 through 080001-5, Aug. 27, 2019, AIP Conference Proceedings.†

*Primary Examiner* — Eli S Mekhlin
(74) *Attorney, Agent, or Firm* — McDermott Will & Emery LLP

(57) ABSTRACT

A 12th solar cell and a 13th solar cell are provided to overlap in part as viewed from a side of a light receiving surface 22. A portion of a light receiving surface of the 12th solar cell and a portion of a back surface of the 13th solar cell face each other in an overlapping portion across a wire. The overlapping portion includes a part where a resin is located both between the light receiving surface of the 12th solar cell and the wire and between the back surface of the 13th cell and the wiring member.

21 Claims, 11 Drawing Sheets

(56) References Cited

U.S. PATENT DOCUMENTS

| | | | |
|---|---|---|---|
| 2012/0325282 A1* | 12/2012 | Snow | H01L 31/0504 |
| | | | 257/E31.11 |
| 2016/0111574 A1* | 4/2016 | Yoshimine | H01L 31/0508 |
| | | | 136/244 |
| 2018/0315875 A1 | 11/2018 | Gragert et al. | |

* cited by examiner
† cited by third party

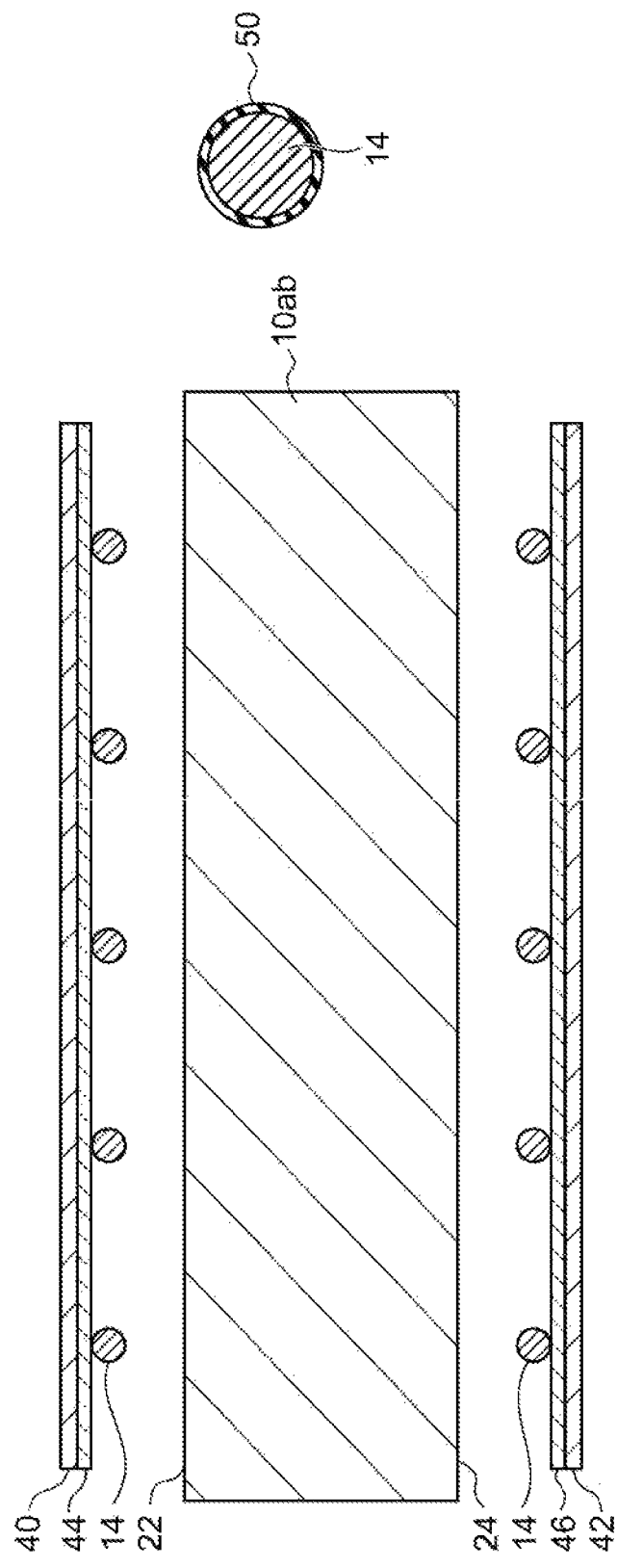

SOLAR CELL MODULE INCLUDING SOLAR CELLS, METHOD OF MANUFACTURING SOLAR CELL MODULE

CROSS-REFERENCE TO RELATED APPLICATION

This application is based upon and claims the benefit of priority from the prior Japanese Patent Application No. 2019-158901, filed on Aug. 30, 2019, the entire contents of which are incorporated herein by reference.

BACKGROUND

1. Field

The disclosure relates to a solar cell module and, more particularly, to a solar cell module including solar cells and a method of manufacturing a solar cell module.

2. Description of the Related Art

In order to facilitate manufacturing of a solar cell module, two films interconnected by a wire are used. One of the two films is attached to the light receiving surface of a solar cell to sandwich the wire between the film and the light receiving surface. Further, the other of the two films is attached to the back surface of a further solar cell to sandwich the wire between the film and the back surface (see, for example, JP2018-530168).

By connecting two adjacent solar cells such that portions of the respective solar cells overlap, the gap between the two solar cells is eliminated. This improves the cell filling factor. Because portions of the respective solar cells are made to overlap each other, however, there is a concern that the load bearing and the thermal cycling resistance may be reduced.

SUMMARY

The disclosure addresses the above-described issue, and a general purpose thereof is to provide a technology of inhibiting reduction in the load bearing the thermal cycling resistance even when two adjacent solar cells are provided such that portions of the respective solar cells overlap each other.

The solar cell module according to an embodiment of the present disclosure includes: a first solar cell including a first surface and a second surface that face in opposite directions; a second solar cell including a first surface and a second surface that face in opposite directions and provided to overlap the first solar cell in part when viewed from a side of the first surface; and a wiring member connected to the first surface of the first solar cell and connected to the second surface of the second solar cell. A portion of the first surface of the first solar cell and a portion of the second surface of the second solar cell face each other in an overlapping portion across the wiring member, and the overlapping portion includes a part where a resin is located both between the first surface of the first solar cell and the wiring member and between the second surface of the second solar cell and the wiring member.

Another embodiment of the present disclosure relates to a method of manufacturing a solar cell module. The method includes: manufacturing a string that connects a first solar cell including a first surface and a second surface that face in opposite directions to a second solar cell including a first surface and a second surface that face in opposite directions and provided to overlap the first solar cell in part when viewed from a side of the first surface, by connecting the first surface of the first solar cell and the second surface of the second solar cell with a wiring member, and sandwiching the string by a protection member and an encapsulant having a storage modulus at room temperature of 20 MPa or lower and a storage modulus at 100° C. of 0.5 MPa or lower, and laminating a stack to induce a temperature of 100° C. or higher in the encapsulant.

BRIEF DESCRIPTION OF THE DRAWINGS

The figures depict one or more implementations in accordance with the present teaching, by way of example only, not by way of limitations. In the figures, like reference numerals refer to the same or similar elements.

FIGS. 4A-4B are cross-sectional views showing a structure of the first film and the second film exhibited before they are attached to the solar cells of FIG. 2.

DETAILED DESCRIPTION

The invention will now be described by reference to the preferred embodiments. This does not intend to limit the scope of the present invention, but to exemplify the invention.

A brief summary will be given before describing the present disclosure in specific details. An embodiment of the present disclosure relates to a solar cell module in which a plurality of solar cells are arranged in a matrix. In the solar cell module, the first protection member, the first encapsulant, the second encapsulant, and the second protection member are arranged in the stated order, starting from the side of the light receiving surface. A plurality of solar cells are encapsulated between the first encapsulant and the second encapsulant. Two adjacent solar cells are connected by a wiring member that is an interconnector. If the two adjacent solar cells are spaced apart, the gap in between is not provided with a solar cell and does not generate power. The paving technology of overlapping portions of two adjacent solar cells in the direction of thickness is used in order to improve the conversion efficiency by improving the cell filling factor. If a load is applied in the direction of thickness of the solar cell where the paving technology is used, the load bearing is predicted to be reduced because the stress is concentrated in the solar cell/wiring member/solar cell portion, possibly producing a crack in the solar cell. Meanwhile, since there will not be any gap between the adjacent solar cells or a portion that modifies the stress on the wiring member, the thermal cycling resistance is predicted to be reduced.

To inhibit reduction in the load bearing and the thermal cycling resistance even in the case of using the paving technology, the solar cell module according to this embodiment is configured such that the overlapping portion where the two solar cells overlap includes a part where the resin is located between the solar cell and the wiring member. The resin inhibits concentration of stress in the cell/wiring member/cell portion caused by application of a load or thermal cycling and prevents production of a crack in the solar cell. As a result, reduction in the load bearing and the thermal cycling resistance is inhibited. The terms "parallel" and "perpendicular" in the following description not only encompass completely parallel or perpendicular but also encompass off-parallel and off-perpendicular within the margin of error. The term "substantially" means identical within certain limits.

Figure 1:
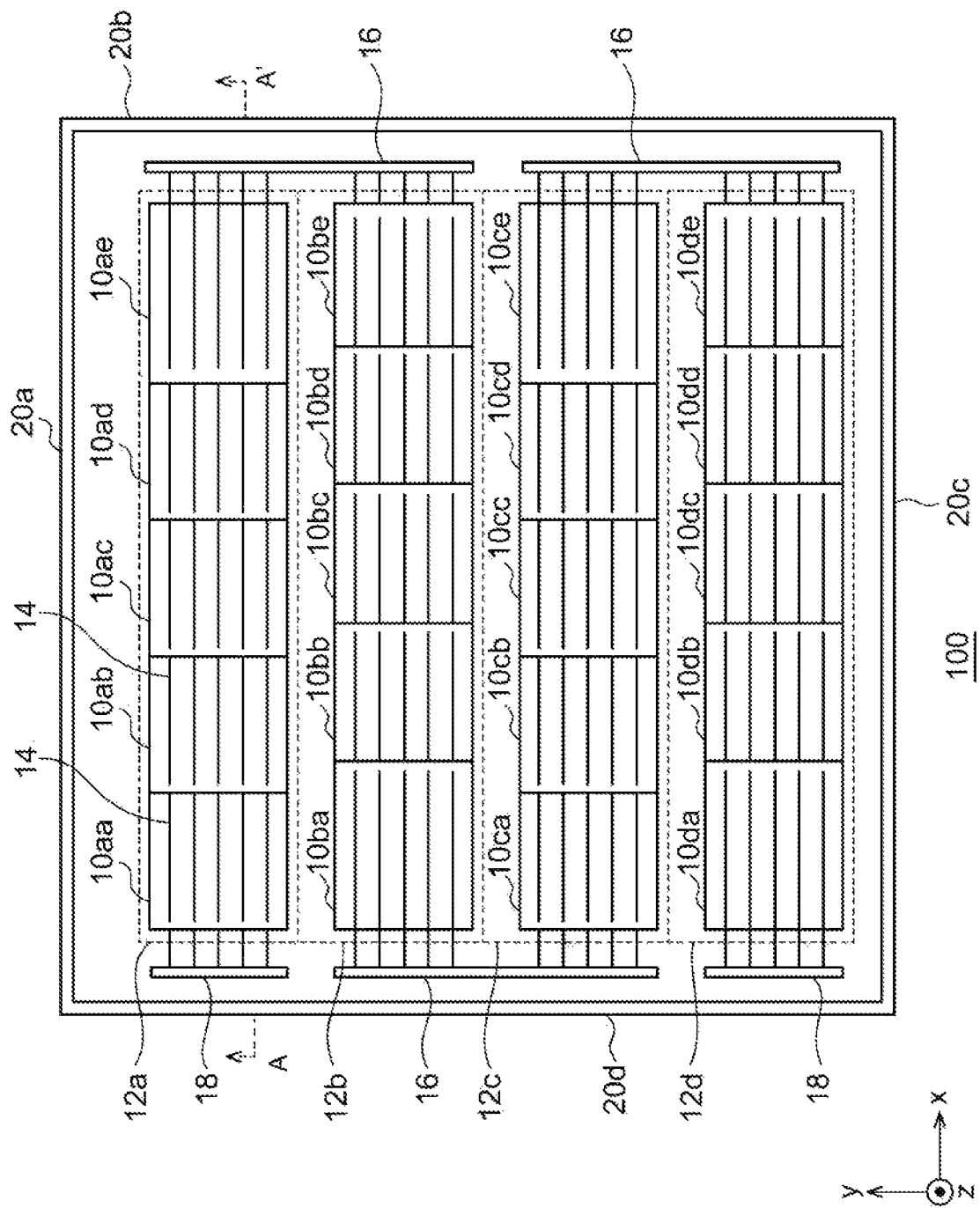
FIG. 1 is a top view showing a structure of a solar cell module according to the embodiment.

FIG. 1 is a top view showing a structure of a solar cell module 100. As shown in FIG. 1, an orthogonal coordinate system including an x axis, y axis, and a z axis is defined. The x axis and y axis are orthogonal to each other in the plane of the solar cell module 100. The z axis is perpendicular to the x axis and y axis and extends in the direction of thickness of the solar cell module 100. The positive directions of the x axis, y axis, and z axis are defined in the directions of arrows in FIG. 1, and the negative directions are defined in the directions opposite to those of the arrows. Of the two principal surfaces forming the solar cell module 100 that are parallel to the x-y plane, the principal surface disposed on the positive direction side along the z axis is the light receiving surface, and the principal surface disposed on the negative direction side along the z axis is the back surface. Hereinafter, the positive direction side along the z axis will be referred to as "light receiving surface side" and the negative direction side along the z axis will be referred to as "back surface side". FIG. 1 can be said to be a plan view of the solar cell module 100 as viewed from the light receiving surface side.

The solar cell module 100 includes an 11th solar cell 10aa, . . . , a 45th solar cell 10de, which are generically referred to as solar cells 10, wires 14, bridge wiring members 16, terminal wiring members 18, a first frame 20a, a second frame 20b, a third frame 20c, and a fourth frame 20d, which are generically referred to as frames 20.

The first frame 20a extends in the x axis direction, and the second frame 20b extends in the negative direction along the y axis from the positive direction end of the first frame 20a along the x axis. Further, the third frame 20c extends in the negative direction along the x axis from the negative direction end of the second frame 20b along the y axis, and the fourth frame 20d connects the negative direction end of the third frame 20c along the x axis and the negative direction end of the first frame 20a along the x axis. The frames 20 bound the outer circumference of the solar cell module 100 and are made of a metal such as aluminum. The solar cell module 100 has a rectangular shape, but the shape of the solar cell module 100 is not limited to the illustrated shape.

Each of the plurality of solar cells 10 absorbs incident light and generates photovoltaic power. In particular, the solar cell 10 generates an electromotive force from the light absorbed on the light receiving surface and also generates photovoltaic power from the light absorbed on the back surface. The solar cell 10 is formed by, for example, a semiconductor material such as crystalline silicon, gallium arsenide (GaAs), or indium phosphorus (InP). The structure of the solar cell 10 is not limited to any particular type. It is assumed here that crystalline silicon and amorphous silicon are stacked by way of example. The solar cell 10 is formed in a rectangular shape on the x-y plane but may have other shapes. For example, the solar cell 10 may have an octagonal shape. A plurality of finger electrodes (not shown in FIG. 1) extending in the y axis direction in a mutually parallel manner are disposed on the light receiving surface and the back surface of each solar cell 10. The finger electrode is a collecting electrode.

The plurality of solar cells 10 are arranged in a matrix on the x-y plane. In this case, five solar cells 10 are arranged in the x axis direction. The five solar cells 10 arranged and disposed in the x axis direction are connected in series by the wire 14, which embody the wiring member or the interconnector mentioned above, so as to form one string 12. For example, a first string 12a is formed by connecting the 11th solar cell 10aa, the 12th solar cell 10ab, . . . , and the 15th solar cell 10ae. The second string 12b through the fourth string 12d are similarly formed. As a result, the four strings 12 are arranged in parallel in the y axis direction. In this case, the number of solar cells 10 arranged in the x axis direction is larger than the number of solar cells 10 arranged in the y axis direction. The number of solar cells 10 included in the string 12 is not limited to "5", and the number of strings 12 is not limited to "4".

In order to form the string 12, the wire 14 connects the finger electrode on the light receiving surface side of one of the solar cells 10 adjacent to each other in the x axis direction and the finger electrode on the back surface side of the other. For example, the five wires 14 for connecting the 11th solar cell 10aa and the 12th solar cell 10ab adjacent to each other electrically connect the finger electrodes on the light receiving surface side of the 11th solar cell 10aa and the finger electrodes on the back surface side of the 12th solar cell 10ab. The number of wires 14 is not limited to "5". Connection between the wire 14 and the solar cell 10 will be described below.

The bridge wiring member 16 extends in the y axis direction and electrically connects the two adjacent strings 12. For example, the 15th solar cell 10ae located at the positive direction end of the first string 12a along the x axis and the 25th solar cell 10be located at the positive direction end of the second string 12b along the x axis are electrically connected by the bridge wiring member 16. Further, the second string 12b and the third string 12c are electrically connected by the bridge wiring member 16 at the negative direction end along the x axis, and the third string 12c and the fourth string 12d are electrically connected by the bridge wiring member 16 at the positive direction end along the x axis. As a result, the plurality of strings 12 are connected in series by the bridge wiring member 16.

The bridge wiring member 16 is not connected to the 11th solar cell 10aa at the negative direction end of the first string 12a along the x axis. Instead, the terminal wiring member 18 is connected. The terminal wiring member 18 is also connected to the 41st solar cell 10da at the negative direction end of the fourth string 12d along the x axis. A lead wiring member (not shown) is connected to the terminal wiring member 18. The lead wiring member is a wiring member for retrieving the electric power generated in the plurality of solar cells 10 outside the solar cell module 100. The configuration of the solar cell module 100 is simplified in FIG. 1, but a plurality of bridge wiring members 16 may be provided on one side in order to provide bypass diodes.

Figure 2:
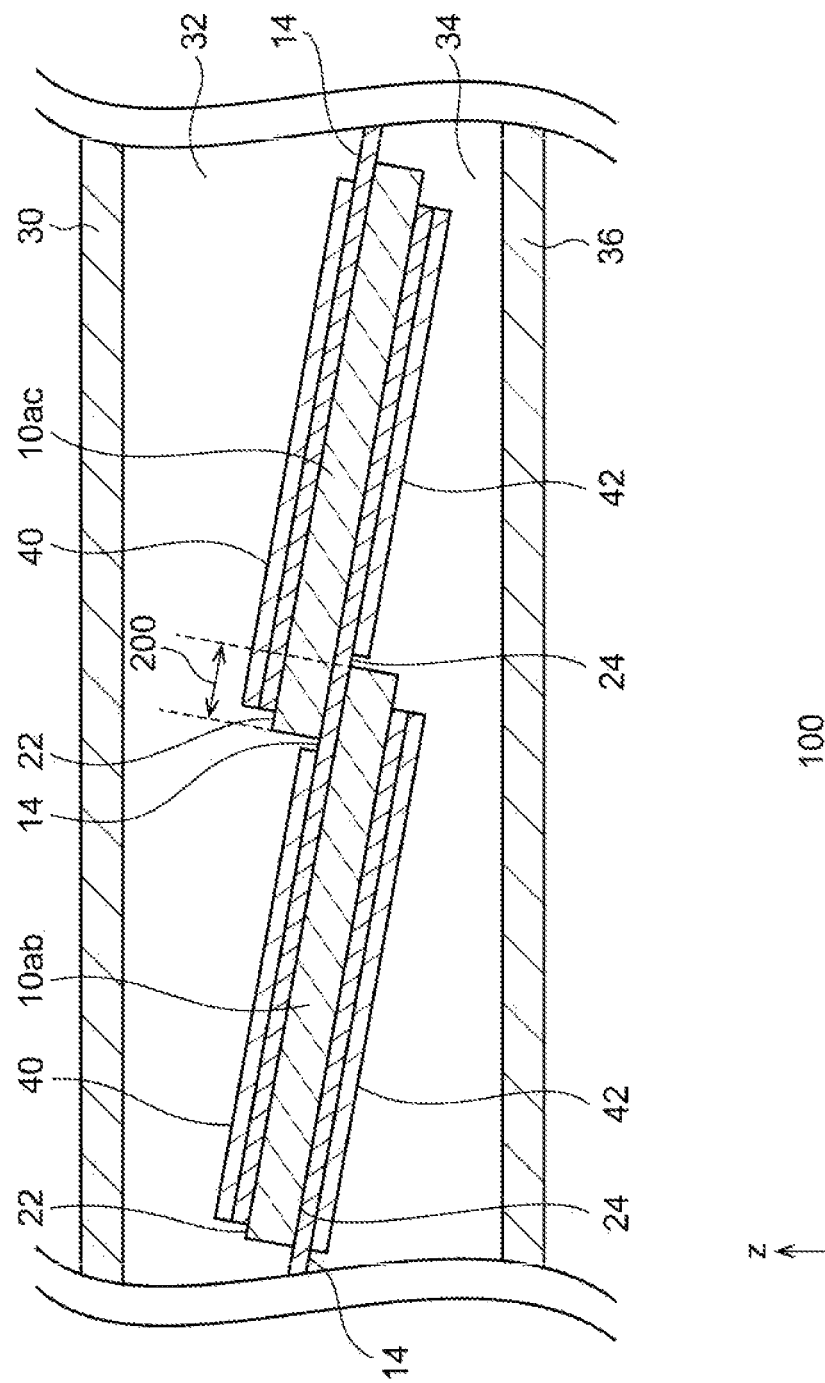
FIG. 2 is a cross sectional view showing a structure of the solar cell module of FIG. 1.

FIG. 2 is a cross sectional view showing a structure of the solar cell module 100 along the x axis and is an A-A' cross sectional view of FIG. 1. The solar cell module 100 includes a 12th solar cell 10ab, a 13th solar cell 10ac, the wires 14, a first protection member 30, a first encapsulant 32, a second encapsulant 34, a second protection member 36, a first film 40, and a second film 42. The top of FIG. 2 corresponds to the light receiving surface side, and the bottom corresponds to the back surface side. The figure shows the 12th solar cell 10ab and the 13th solar cell 10ac, but the other solar cells have the same structure.

The first protection member 30 is disposed on the light receiving surface side of the solar cell module 100 and protects the surface of the solar cell module 100. Further, the solar cell module 100 is shaped in a rectangle bounded by the frames 20 on the x-y plane. The first protection member 30 is formed by using a translucent and water shielding glass, translucent plastic, etc. The first protection member 30 increases the mechanical strength of the solar cell module 100.

The first encapsulant 32 is stacked on the back surface side of the first protection member 30. The first encapsulant 32 is disposed between the first protection member 30 and the solar cell 10 and adhesively bonds the first protection member 30 and the solar cell 10. For example, a thermoplastic resin film of polyolefin, ethylene-vinyl acetate copolymer (EVA), polyvinyl butyral (PVB), polyimide, or the like may be used as the first encapsulant 32. A thermosetting resin may alternatively be used. Details of the first encapsulant 32 will be described later. The first encapsulant 32 is formed by a translucent sheet member having a surface of substantially the same dimension as the x-y plane in the first protection member 30.

Figure 3:
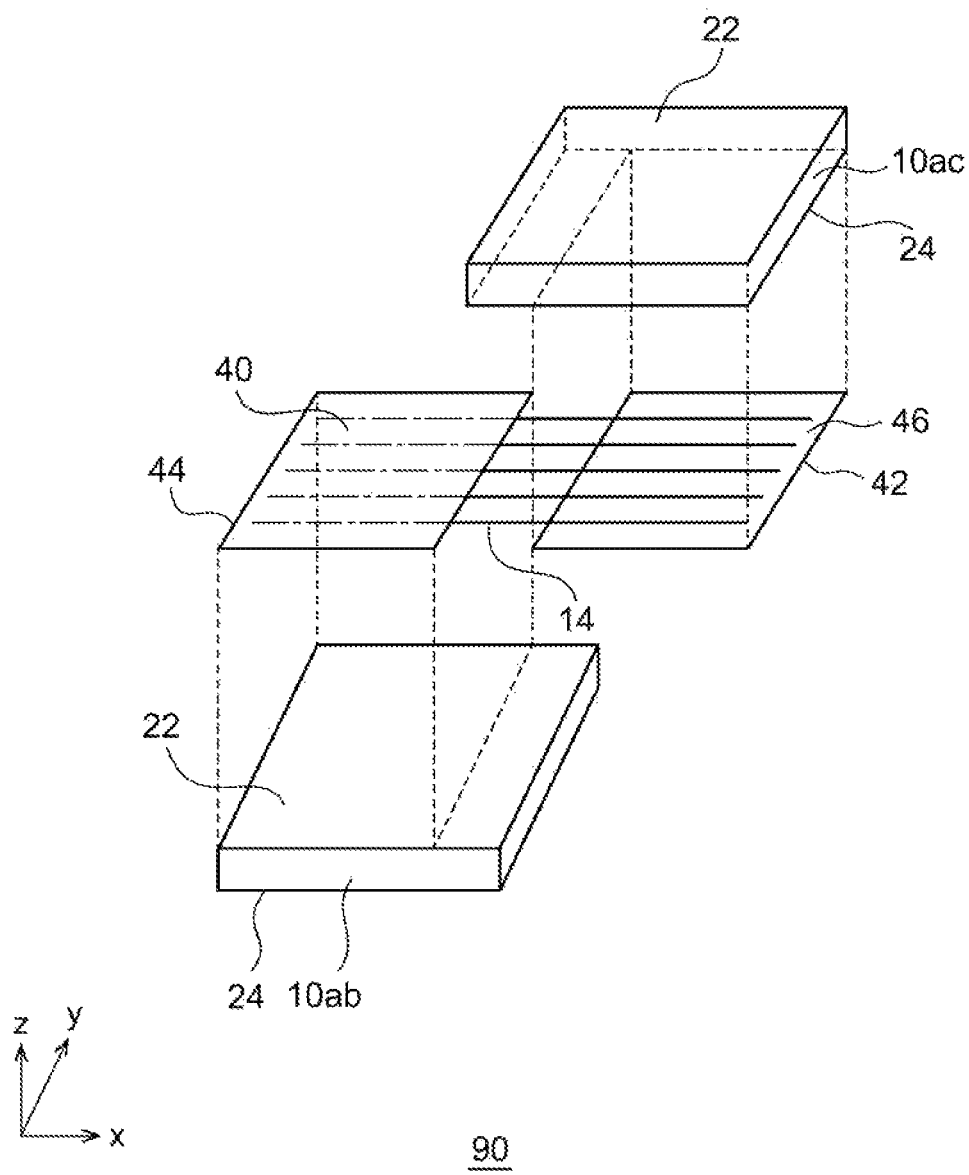
FIG. 3 is a perspective view showing a structure of a wire film used in the solar cell module of FIG. 2.

The 12th solar cell 10ab and the 13th solar cell 10ac are stacked on the back surface side of the first protection member 30. The solar cells 10 are provided such that the light receiving surface 22 faces the positive direction side along the z axis and the back surface 24 faces the negative direction side along the z axis. Given that the light receiving surface 22 is referred to as the "first surface", the back surface 24 is referred to as the "second surface". Further, the 13th solar cell 10ac is provided such that a portion thereof overlaps the 12th solar cell 10a as viewed from the light receiving surface side. More specifically, the portion of the back surface 24 of the 13th solar cell 10ac on the negative direction side along the y axis overlaps the portion of the light receiving surface 2 of the 12th solar cell 10ab on the positive direction side along the x axis. The portion where the two adjacent solar cells 10 overlap is referred to as an overlapping portion 200. The wire 14 and the first film 40 are provided on the light receiving surface 22 of the solar cell 10, and the wire 14 and the second film 42 are provided on the back surface 24 of the solar cell 10. The first film 40 and the second film 42 are also referred to as foils. FIG. 3 will be used to describe the arrangement of the wire 14, the first film 40, and the second film 42 in the solar cell 10.

FIG. 3 is a perspective view showing a structure of a wire film 90 used in the solar cell module 100. The wire film 90 and the solar cell module 100 are manufactured separately. The wire film 90 includes the wire 14, the first film 40, the second film 42, a first adhesion layer 44, and a second adhesion layer 46. The first film 40 is provided on the side of the light receiving surface 22 of one of the two adjacent solar cells 10 (for example, the 12th solar cell 10ab). The first adhesion layer 44 is provided on the surface of the first film 40 toward the 12th solar cell 10ab, and a plurality of wires 14 are provided on the first adhesion layer 44. The first adhesion layer 44 can adhesively bond the first film 40 and the plurality of wires 14 to the light receiving surface 22 of the 12th solar cell 10ab. The arrangement of the first film 40 and the plurality of wires 14 relative to each other is shown in FIG. 4A described later. For example, the thickness of the first adhesion layer 44 is several-several tens of μm, the thickness of the first film 40 is about 50-100 μm, the thickness of the 12th solar cell 10ab is 50-80 μm, and the diameter of the wire 14 is about 100-500 μm.

The second film 42 is provided on the side of the back surface 24 of the other of the two adjacent solar cells 10 (for example, the 13th solar cell 10ac). The second adhesion layer 46 is provided on the surface of the second film 42 toward the 13th solar cell 10ac, and a plurality of wires 14 are provided on the second adhesion layer 46. The second adhesion layer 46 can adhesively bond the second film 42 and the plurality of wires 14 to the back surface 24 of the 13th solar cell 10ac. This allows the plurality of wires 14 to be connected to the light receiving surface 22 of the 12th solar cell 10ab and to the back surface 24 of the 13th solar cell 10ac. As a result, the finger electrodes (not shown) of the solar cells 10 are connected by the plurality of wires 14. The arrangement of the second film 42 and the plurality of wires 14 relative to each other is shown in FIG. 4A described later.

If, for example, the size of the first film 40 is configured to be smaller than the size of the light receiving surface 22 of the 12th solar cell 10ab, the first film 40 will not be located in the portion on the light receiving surface 22 of the 12th solar cell 10ab toward the 13th solar cell 10ac. Further, if the size of the second film 42 is configured to be smaller than the size of the back surface 24 of the 13th solar cell 10ac, the second film 42 will not be located in the portion on the back surface 24 of the 13th solar cell 10ac toward the 12th solar cell 10ab. As a result, a portion of the light receiving surface 22 of the 12th solar cell 10ab and a portion of the back surface 24 of the 13th solar cell 10ac face each other across the wire 14 as shown in FIG. 2. For example, the light receiving surface 22 of the 12th solar cell 20ab and the back surface 24 of the 13th solar cell 10ac overlap in the overlapping portion 200 across the wire 14 on which the first film 40 or the second film 42 is not provided. The length of the overlapping portion 200 in the direction from the 12th solar cell 10ab toward the 13th solar cell 10ac, i.e., the overlapping width, is configured to be 0.2-0.5 mm.

The structure of the first film 40 and the second film 42 shown in FIG. 3 will be described in further detail. FIGS. 4A-4B are cross-sectional views showing a structure of the first film 40 and the second film 42 exhibited before they are attached to the solar cells 10. In particular, FIG. 4A is a cross-sectional view exhibited when the neighborhood of the 12th solar cell 10ab of FIG. 2 is severed along the y axis and is a cross-sectional view exhibited before the first film 40 and the second film 42 are attached to the 12th solar cell 10ab. As shown in FIG. 2, the first film 40 and the second film 42 shown in FIG. 4A are included in mutually different wire films 90.

The first film 40 is formed by a transparent resin film of, for example, polyethylene terephthalate (PET). The first film 40 has rectangular shape of a size equal to or smaller than the size of the solar cell 10 on the x-y plane. For example, polyolefin is used for the first adhesion layer 44 provided on the back surface side of the first film 40, but EVA may be used. The first adhesion layer 44 has a shape similar to that of the first film 40 on the x-y plane. A plurality of wires 14 are provided on the back surface side of the first adhesion layer 44.

FIG. 4B is a cross-sectional view of the wire 14 in the same direction as that of FIG. 4A. The wire 14 extends in a cylindrical shape and has a circular cross section. The wire 14 has a diameter of 100-500 μm, and, preferably, 300 μm, and so is thinner in width of 1-2 mm of a tab line commonly used in a solar cell module. The wire 14 is configured to contain copper. The outer circumference of the wire 14 is coated with a solder layer 50 having a thickness of 5 μm to 30 μm. The solder layer 50 is formed by a solder having a low melting point. For example, the solder has a composition tin-silver-bismuth. In that case, the melting point of the solder layer 50 would be about 140° C. The finger electrode of the solar cell 10 may be connected to the solder layer 50 of the wire 14. Reference is made back to FIG. 4A. The figure shows five wires 14 by way of example, but, generally, the number of wires 14 is 10-20, which is larger than the number of tab lines commonly used in a solar cell module.

Like the first film 40, the second film 42 is formed by a transparent resin film. The second film 42 may be formed by a non-transparent resin film. For example, the second film 42 may be a white resin film. The second film 42 has a rectangular shape of a size equal to or smaller than the size of the solar cell 10 on the x-y plane. As in the first adhesion layer 44, polyolefin or EVA is used for the second adhesion layer 46 provided on the light receiving side of the second film 42. The second adhesion layer 46 has a shape similar to that of the second film 42 on the x-y plane. A plurality of wires 14 are provided on the light receiving surface side of the second adhesion layer 46. The structure of the wire 14 is as shown in FIG. 4B. Reference is made back to FIG. 2.

By bonding the first film 40 and the second film 42 equally to the other solar cells 10, the string 12 as shown in FIG. 1 is formed. The second encapsulant 34 is stacked on the back surface side of the first encapsulant 32. The second encapsulant 34 encapsulates the plurality of solar cells 10, the wires 14, the bridge wiring members 16, the terminal wiring members 18, the first films 40, the second films 42, etc., sandwiching the cells, the wires, the members, and the films between the first encapsulant 32 and the second encapsulant 34. In other words, the first encapsulant 32 encapsulates the solar cell 10 from the side of the light receiving surface 22 to which the wire 14 is bonded by the first adhesion layer 44, and the second encapsulant 34 encapsulates the solar cell 10 from the side of the back surface 24 to which the wire 14 is bonded by the second adhesion layer 46. The same material as used for the first encapsulant 32 may be used for the second encapsulant 34. Further, the second encapsulant 34 is integrated with the first encapsulant 32 by heating the encapsulants in a laminate cure process.

The second protection member 36 is stacked on the back surface side of the second encapsulant 34 so as to be opposite to the first protection member 30. The second protection member 36 protects the back surface side of the solar cell module 100 as a back sheet. A resin film of, for example, PET, polytetrafluoroethylene (PTFE), polyvinyl fluoride (PVF) etc., a stack film having a structure in which an Al foil is sandwiched by resin films of polyolefin, or the like is used as the second protection member 36.

Figure 5A:
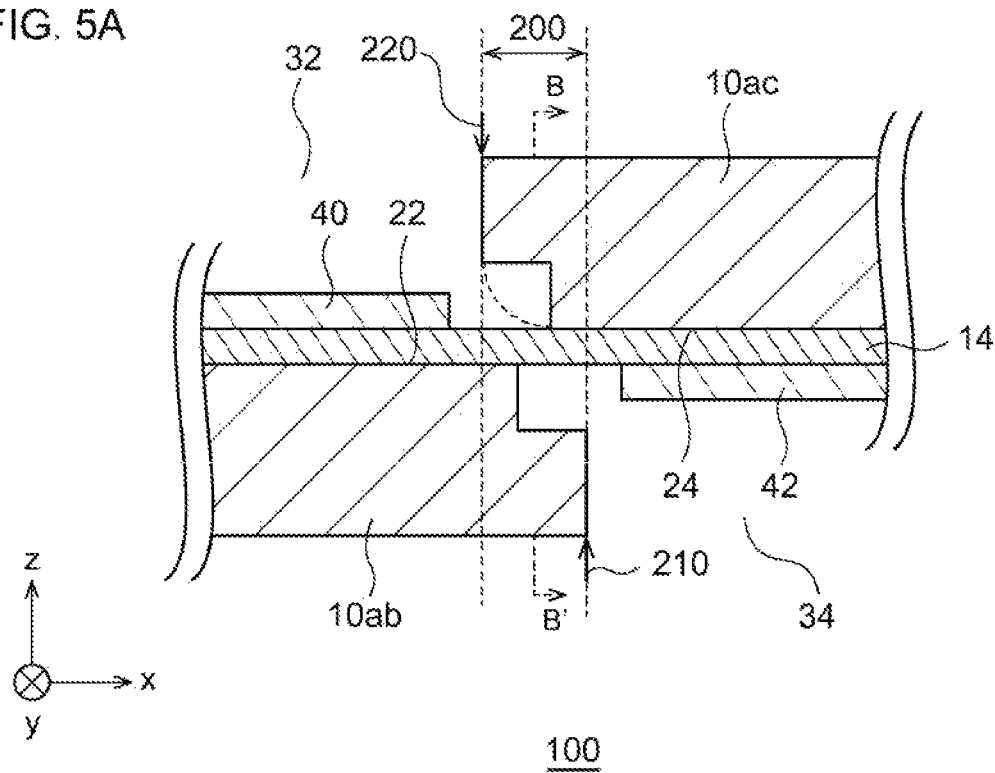
FIGS. 5A-5B are partial cross-sectional views showing a structure of the solar cell module of FIG. 1.
Figure 5B:
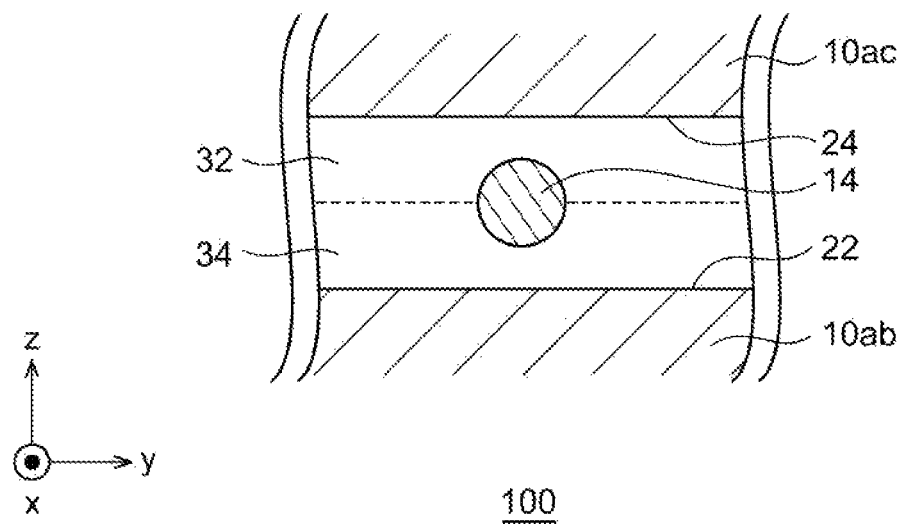

A description will now be given, with reference to FIGS. 5A-5B, of a structure for inhibiting reduction in the load bearing and the thermal cycling resistance even in the case of using paving technology. FIGS. 5A-5B are partial cross-sectional views showing a structure of the solar cell module 100. In particular, FIG. 5A is a partial cross-section view showing the vicinity of the overlapping portion 200 in FIG. 2. As shown in FIG. 2, the direction in which the wire 14 extends is not aligned with the x axis. For clarity of the description, however, the direction in which the wire 14 extends will be referred to as the x axis below.

The overlapping portion 200 includes a part where the second encapsulant 34 is located between the light receiving surface 22 of the 12th solar cell 10ab and the wire 14. In particular, the second encapsulant 34 is located in a part of the overlapping portion 200 where a first end 210 of the 12th solar cell 10ab is provided. This is to modify, by means of the second encapsulant 34, the stress applied on the 12th solar cell 10ab when the 12th solar cell 10ab comes into contact with the wire 14. Further, the overlapping portion 200 includes a part where the first encapsulant 32 is located between the back surface 24 of the 13th solar cell 10ac and the wire 14. In particular, the first encapsulant 32 is located in a part of the overlapping portion 200 where a second end 220 of the 13th solar cell 10ac is provided. This is to modify, by means of the first encapsulant 32, the stress applied on the 13th solar cell 10ac when the 13th solar cell 10ac comes into contact with the wire 14.

The figure shows as if the portion of the light receiving surface 22 of the 12th solar cell 10ab toward the first end 210 and the portion of the back surface 24 of the 13th solar toward the second end 220 are chipped. However, the portions are illustrated as if they are chipped merely to clearly show that the first encapsulant 32, the second encapsulant 34, etc. enter a space between the light receiving surface 22 of the 12th solar cell 10ab and the wire 14 and a space between the back surface 24 of the 13th solar cell 10ac and the wire 14, and the portions are not chipped in reality. Also, in reality, the 12th solar cell 10ab and the 13th solar cell 10ac are warped outside by an amount commensurate with the volume of the first encapsulant 32, the second encapsulant 34, etc. that enter the respective spaces. The 13th solar cell 10ac may have a shaped indicated by the dotted line in the figure. The is true of the subsequent figures.

The first encapsulant 32 and the second encapsulant 34 are transparent fillers and are made of the material mentioned above. The first encapsulant 32 and the second encapsulant 34 may be laminated and integrated and are contiguous with each other. The first encapsulant 32 and the second encapsulant 34 desirably have crosslinkability, flexibility, and high fluidity. This is because a soft crosslinking filler is effective to maintain the load bearing and the thermal cycling (TC) resistance. Also, high fluidity is necessary to provide the filler at a desired location. Accordingly, the first encapsulant 32 and the second encapsulant 34 have a gel fraction after cure of 50% or higher, the gel fraction being a measure of crosslinkability. Further, the first encapsulant 32 and the second encapsulant 34 have a storage modulus at room temperature of 20 MPa or lower (preferably, 15 MPa or lower, and, more preferably, 10 PMa or lower), the storage modulus being a measure of flexibility. Further, the first encapsulant 32 and the second encapsulant 34 have a storage modulus at 100° C. of 0.5 MPa or lower (preferably, 0.1 MPa or lower, and, more preferably, 0.01 PMa or lower), the storage modulus being a measure of high fluidity.

The first encapsulant 32 and the second encapsulant 34 may be made of different materials, and the second encapsulant 34 may be colored in white. For example, the first encapsulant 32 may be made of polyolefin, and the second encapsulant 34 may be made of EVA. Crosslinkability and high fluidity are also required in the EVA second encapsulant 34. The second encapsulant 34 is provided as if it is hidden by the plurality of solar cells 10 so that it is not visible from the light receiving surface side.

FIG. 5B is a B-B' cross-sectional view of FIG. 5A. The figure is a cross-sectional view of a part of the overlapping portion 200 outside the part where the first end 210 of the 12th solar cell 10ab and the second end 220 of the 13th solar cell 10ac are provided. In the overlapping portion 200, the light receiving surface 22 of the 12th solar cell 10ab and the wire 14 are not connected, and the back surface 24 of the 13th solar cell 10ac and the wire 14 are not connected. This increases the freedom of movement of the wire 14 and reduces the stress applied by the wire 14 to the 12th solar cell 10ab and the 13th solar cell 10ac.

The fact that the wire 14 is surrounded by a crosslinking resin provides the three following advantages. The first advantage is that the softness of the resin reduces the stress from the load. The advantage is derived from the fact that the interposed softness provides a cushion. The second advantage is that the lack of connection modifies the stress undergone during a thermal cycle. The advantage is provided because there is larger clearance that accommodates expansion and contraction than when the wire 14 and the solar cell 10 are connected over the entire region. The third advantage is that the resin crosslinking reduces the expansion and contraction stress undergone during a thermal cycle. The advantage is provided because the non-crosslinked resin causes serious expansion and contraction.

In the parts of the overlapping portion 200 where the first end 210 of the 12th solar cell 10ab and the second end 220 of the 13th solar cell 10ac are respectively provided, each of the sum of the heights of the wire 14 and the first encapsulant 32 and the sum of the heights of the wire 14 and the second encapsulant 34 is configured to be larger than the sum of the heights of the wire 14 and the conductive substance (not shown). The conductive substance is, for example, a solder for connecting the wire 14 and the solar cell 10. In the overlapping portion 200, the volume of the first encapsulant 32 and the second encapsulant 34 is configured to be larger than the volume of the wire 14 between the light receiving surface 22 of the 12th solar cell 10ab and the back surface 24 of the 13th solar cell 10ac.

Figure 6A:
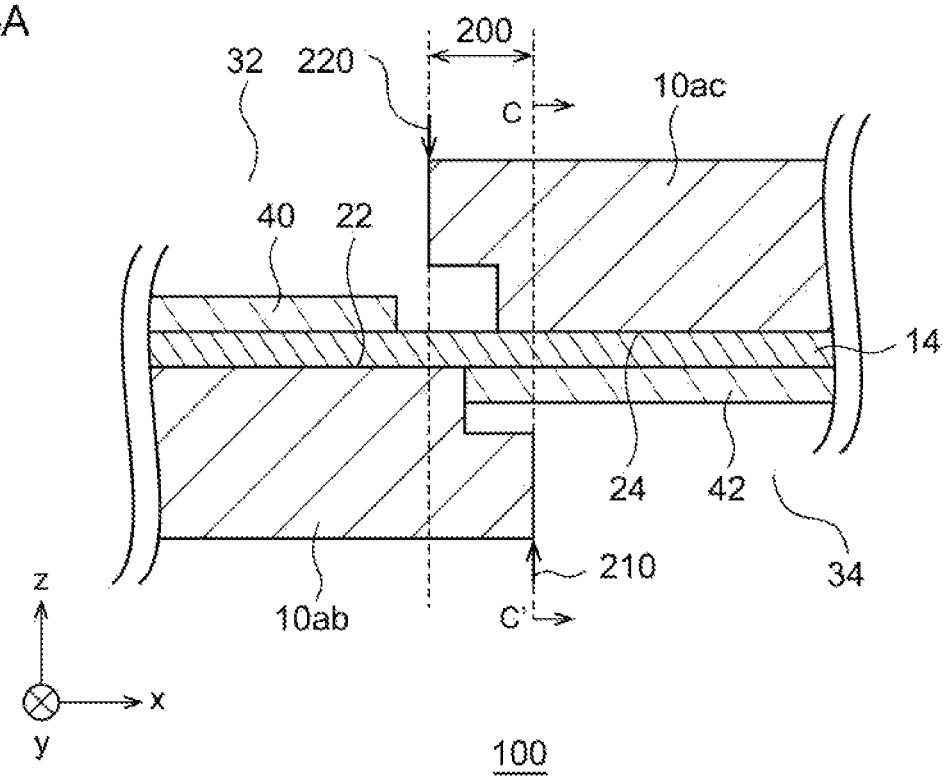
FIGS. 6A-6B are partial cross-sectional views showing a structure of the solar cell module of FIG. 1 according to the first variation.
Figure 6B:
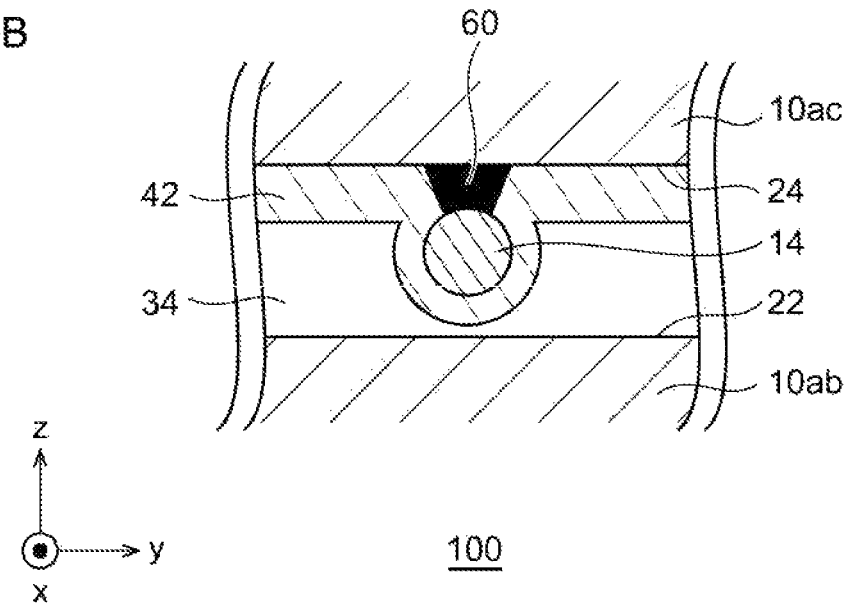

The structure for inhibiting reduction in the load bearing and the thermal cycling resistance by using the paving technology is not limited to the one shown in FIGS. 5A-5B. FIGS. 6A-6B are partial cross-sectional views showing a structure of the solar cell module 100 according to the first variation. In particular, FIG. 6A is a partial cross-section view showing the vicinity of the overlapping portion 200 in FIG. 2. The description below highlights a difference from the structure discussed above. FIG. 6A shows that the second film 42 attached to the back surface 24 of the 13th solar cell 10ac is also provided in the overlapping portion 200. Therefore, two types of resin are included between the light receiving surface 22 of the 12th solar cell 10ab and the wire 14 in the overlapping portion 200. The two types of resin are the second encapsulant 34 and the second film 42. Two or more types of resin may be included between the light receiving surface 22 of the 12th solar cell 10ab and the wire 14 in the overlapping portion 200. The crosslinkability of the second film 42 is lower than the crosslinkability of the first encapsulant 32 and the second encapsulant 34. Thus, the gel fraction of the first encapsulant 32 and the second encapsulant 34 is 50% or higher, and the gel fraction of the second film 42 is 50% or lower.

FIG. 6B is a C-C' cross-sectional view of FIG. 6A. The figure shows a cross-sectional view at the first end 210 of the 12th solar cell 10ab. The description below highlights a difference from the structures discussed above. The conductive substance 60 electrically and mechanically connects the wire 14 to the back surface 24 of the 13th solar cell 10ac. The conductive substance 60 is, for example, a solder, a conductive adhesive, etc. The conductive substance 60 allows the second film 42 to be arranged to coat the back surface 24, to which the wire 14 is attached, from the negative direction side along the z axis. Further, the second encapsulant 34 is provided between the second film 42 and the light receiving surface 22. Since two different types of resin that differ in flexibility and crosslinkability are used, reduction in the load bearing and the thermal cycling resistance is inhibited more successfully than in the case of using one type of resin.

Figure 7:
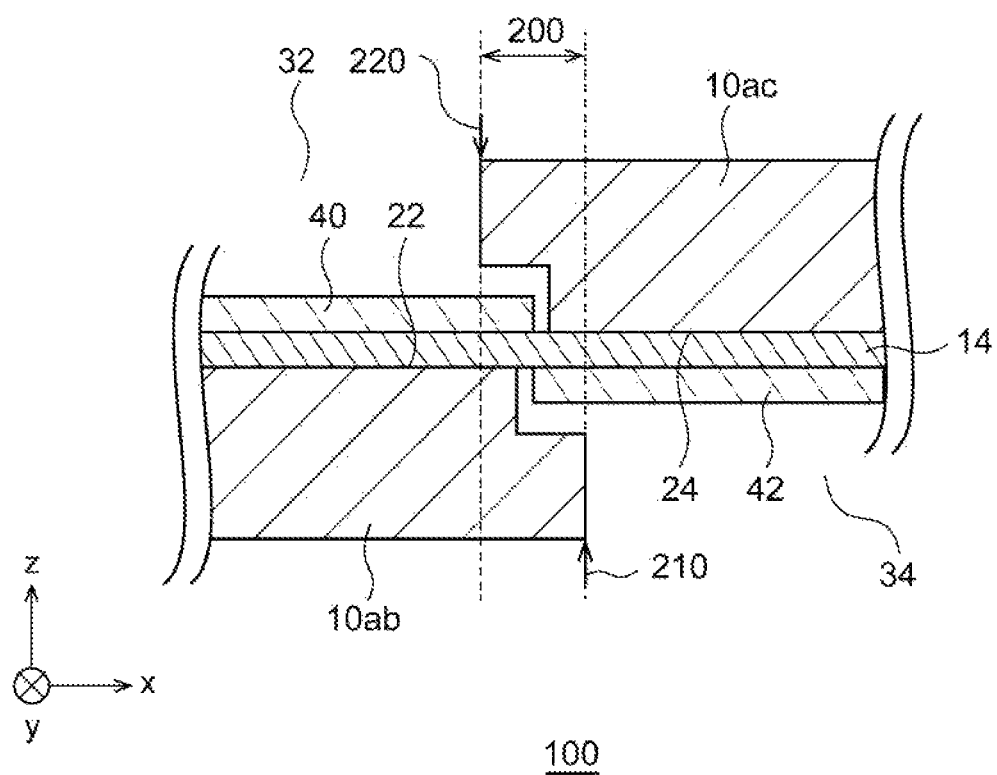
FIG. 7 is a partial cross-sectional view showing a structure of the solar cell module of FIG. 1 according to the second variation.

FIG. 7 is a partial cross-sectional view showing a structure of the solar cell module 100 according to the second variation. In particular, FIG. 7 is a partial cross-section view showing the vicinity of the overlapping portion 200 in FIG. 2. The description below highlights a difference from the structures discussed above. FIG. 7 shows that the first film 40 attached to the light receiving surface 22 of the 12th solar cell 10ab is also provided in the overlapping portion 200. Therefore, two types of resin are included between the back surface 24 of the 13th solar cell 10ac and the wire 14 in the overlapping portion 200. The two types of resin are the first encapsulant 32 and the first film 40. The relationship between the crosslinkability of the first film 40 and the crosslinkability of the first encapsulant 32 and the second encapsulant 34 is the same as the aforementioned relationship between the crosslinkability of the second film 42 and the crosslinkability of the first encapsulant 32 and the second encapsulant 34. The first encapsulant 32 and the second encapsulant 34 may be made of different materials, and the second encapsulant 34 may be colored in white.

Figure 8A:
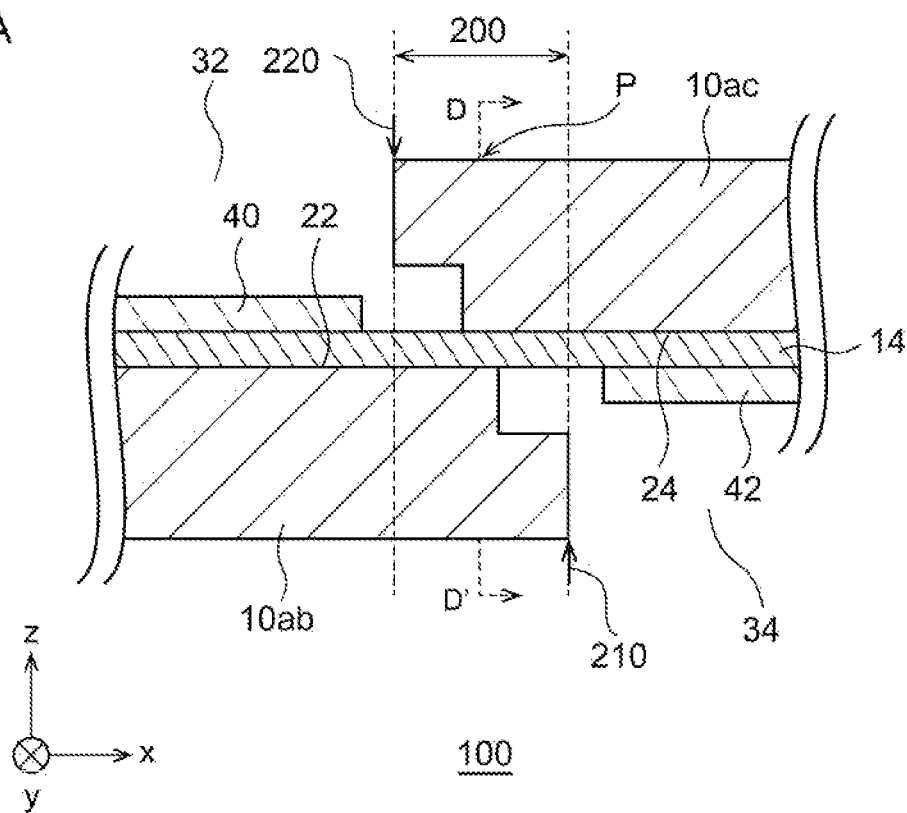
FIGS. 8A-8B are partial cross-sectional views showing a structure of the solar cell module of FIG. 1 according to the third variation.
Figure 8B:
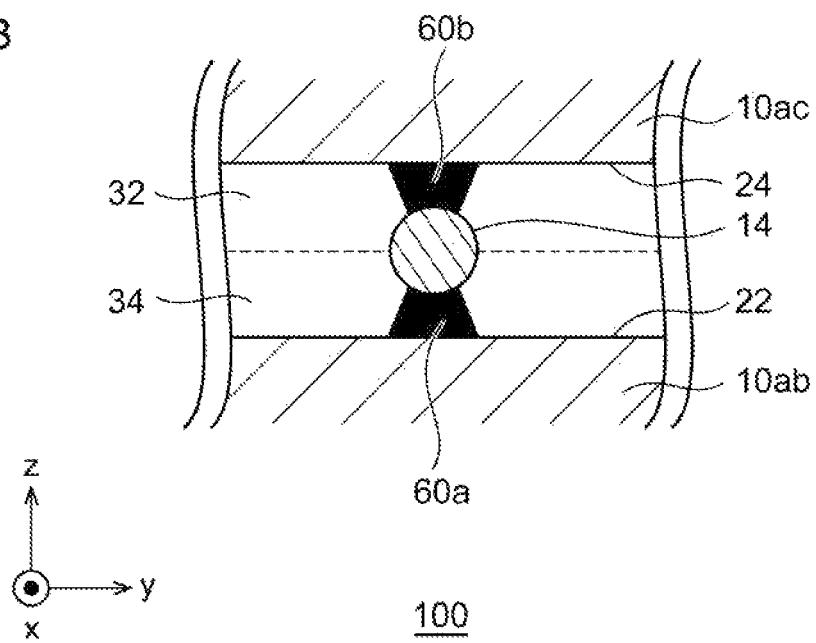

FIGS. 8A-8B are partial cross-sectional views showing a structure of the solar cell module 100 according to the third variation. In particular, FIG. 8A is a partial cross-section view showing the vicinity of the overlapping portion 200 in FIG. 2. The description below highlights a difference from the structures discussed above. FIG. 8A shows that the light receiving surface 22, the wire 14, and the back surface 24 are provided without a resin being interposed. Since the light receiving surface 22, the wire 14, and the back surface 24 are provided without a resin being interposed, electric resistance is reduced.

Accordingly, the conversion efficiency of the solar cell module 100 is improved.

FIG. 8B is a D-D' cross-sectional view of FIG. 8A. The description below highlights a difference from the structures discussed above. A first conductive substance 60a electrically and mechanically connects the wire 14 to the light receiving surface 22 of the 12th solar cell 10ab, and a second conductive substance 60b electrically and mechanically connects the wire 14 to the back surface 24 of the 13th solar cell 10ac. The first conductive substance 60a and the second conductive substance 60b are the same as the conductive substance 60 mentioned above.

Figure 9A:
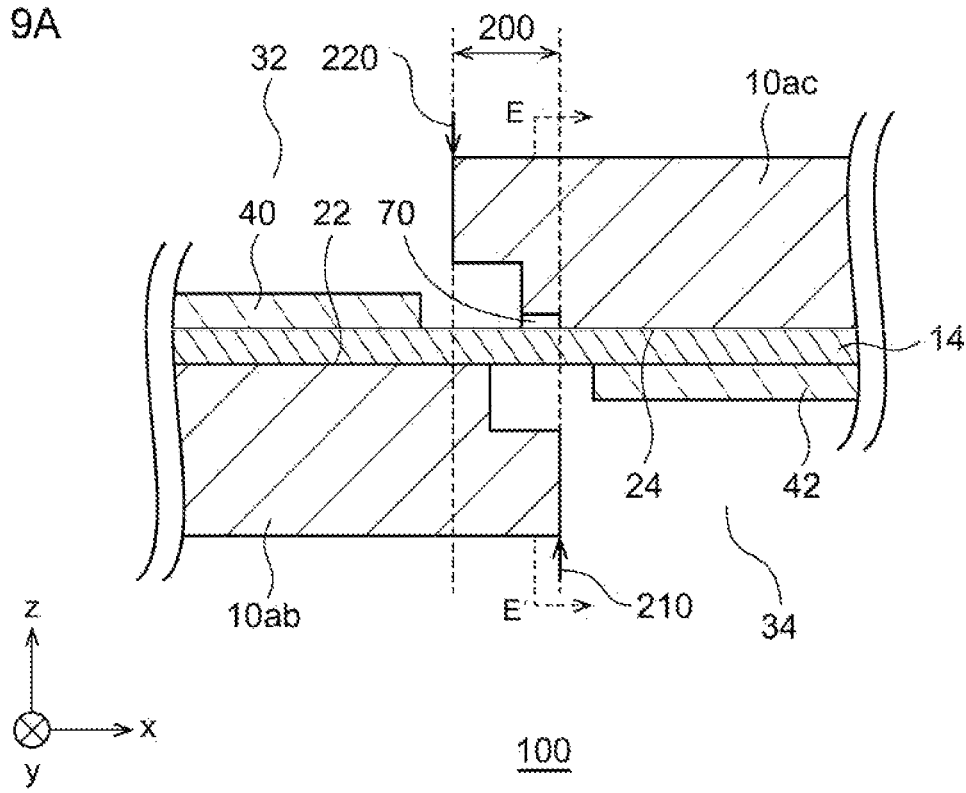
FIGS. 9A-9B are partial cross-sectional views showing a structure of the solar cell module of FIG. 1 according to the fourth variation.
Figure 9B:
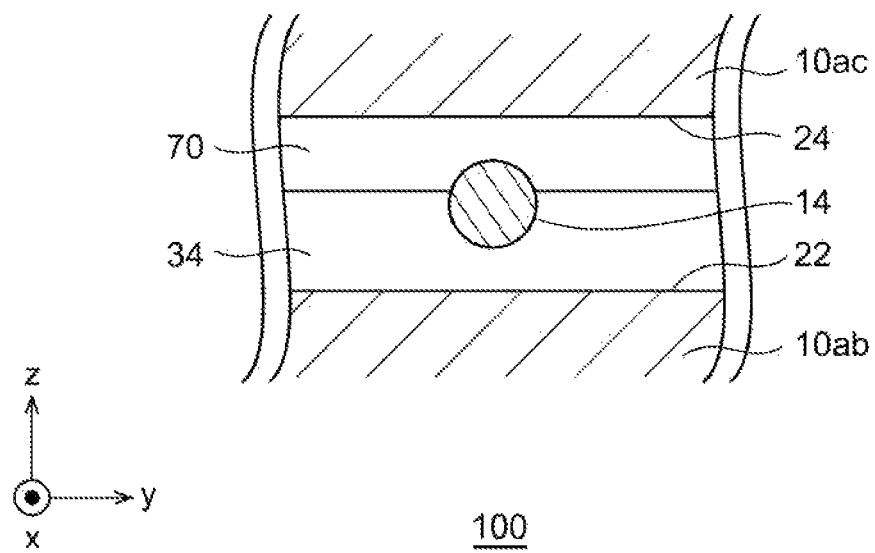

FIGS. 9A-9B are partial cross-sectional views showing a structure of the solar cell module 100 according to the fourth variation. In particular, FIG. 9A is a partial cross-section view showing the vicinity of the overlapping portion 200 in FIG. 2. The description below highlights a difference from the structures discussed above. The overlapping portion 200 includes a part where the second encapsulant 34 is located between the light receiving surface 22 of the 12th solar cell 10*ab* and the wire 14 and a part where the first encapsulant 32 is located between the back surface 24 of the 13th solar cell 10*ac* and the wire 14. This feature is similar to that of FIG. 5A. FIG. 9A further shows that a gap 70, in addition to the first encapsulant 32, is located in the part of the overlapping portion 200 between the back surface 24 of the 13th solar cell 10*ac* and the wire 14. The gap 70 is a space where the first encapsulant 32 did not flow into when the solar cell module 100 was manufactured. The gap 70 may be located in the part of the overlapping portion 200 between the light receiving surface 22 of the 12th solar cell 10*ab* and the wire 14. By forming the gap 70, the stress is modified, and reduction in the load bearing and the thermal cycling resistance is inhibited. Further, the gap 70 provides a clearance that accommodates the movement of the wire 14 and inhibits reduction in the load bearing and the thermal cycling resistance.

FIG. 9B is a E-E' cross-sectional view of FIG. 9A. The description below highlights a difference from the structures discussed above. The gap 70 is provided to be contiguous with the back surface 24 of the 13th solar cell 10*ac*. Further, outside the part of the gap 70, the wire 14 and the second encapsulant 34 are provided between the light receiving surface 22 of the 12th solar cell 10*ab* and the back surface 24 of the 13th solar cell 10*ac*.

Figure 10A:
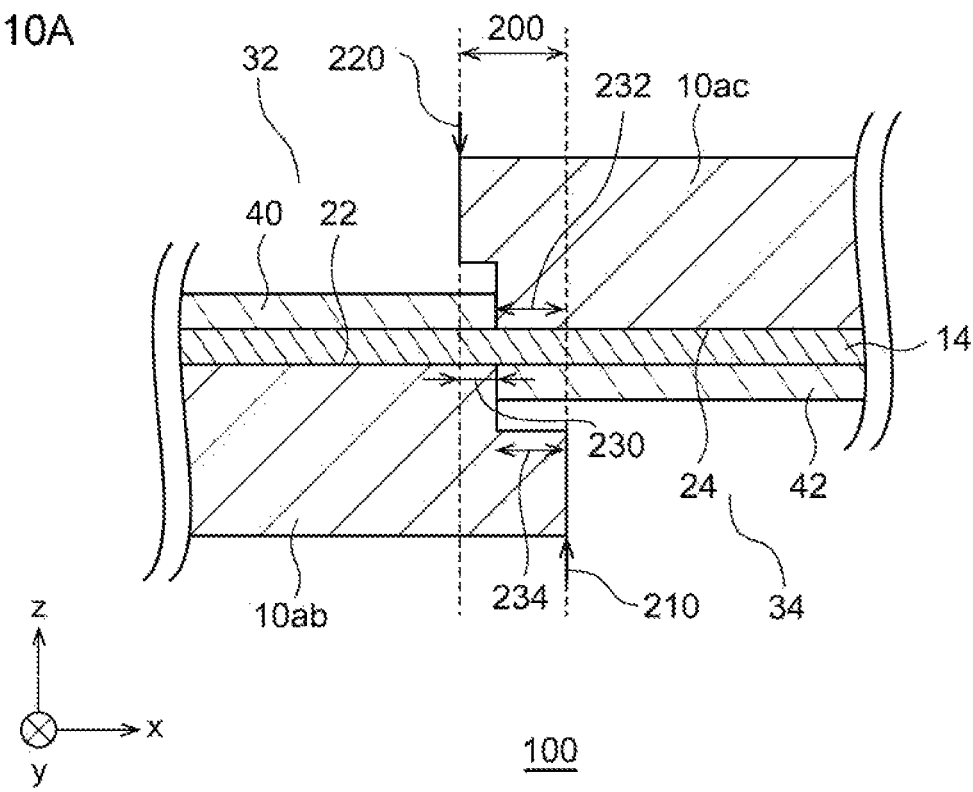
FIGS. 10A-10B are partial cross-sectional views showing structures of the solar cell module of FIG. 1 according to the fifth variation and the sixth variation.
Figure 10B:
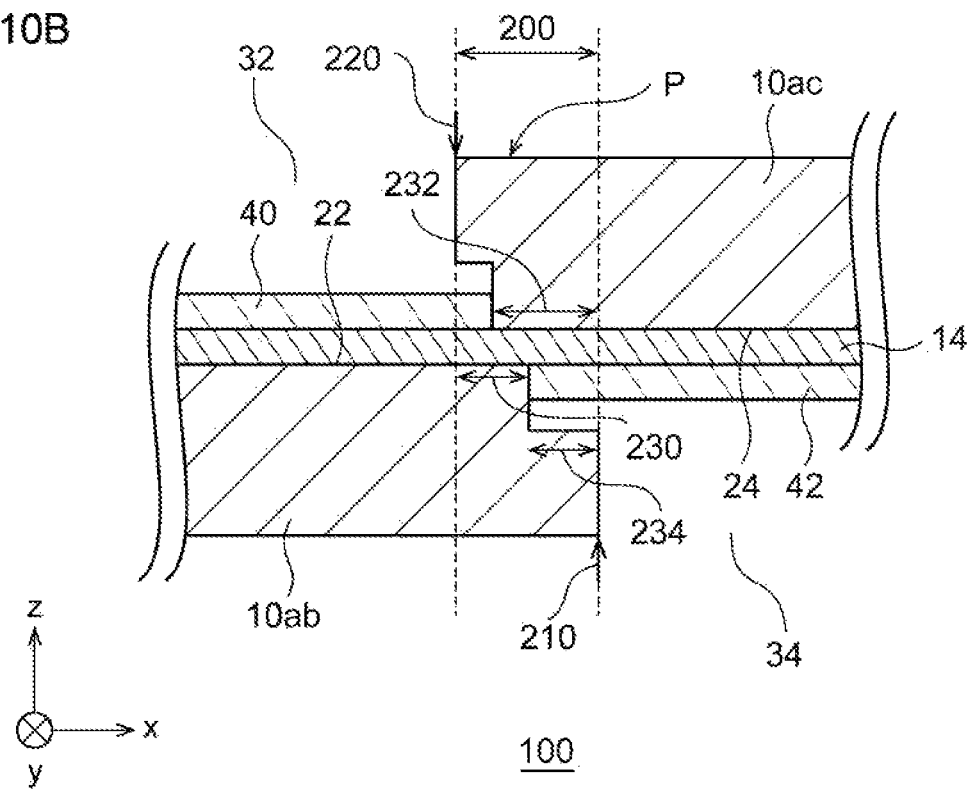

FIGS. 10A-10B are partial cross-sectional views showing structures of the solar cell module 100 according to the fifth variation and the sixth variation. In particular, FIG. 10A is a partial cross-section view according to the fifth variation showing the vicinity of the overlapping portion 200 in FIG. 2. The description below highlights a difference from the structures discussed above. The part of the overlapping portion 200 where the light receiving surface 22 of the 12th solar cell 10*ab* and the wire 14 are in contact is illustrated as a first connection part 230. Further, the part where the back surface 24 of the 13th solar cell 10*ac* and the wire 14 are in contact is illustrated as a second connection part 232. It should be noted here that the area of the first connection part 230 and the area of the second connection part 232 are different. More specifically, the area of the second connection part 232 is larger than the area of the first connection part 230.

The part of the overlapping portion 200 where the light receiving surface 22 of the 12th solar cell 10*ab* and the wire 14 are not in contact is illustrated as a non-connection part 234. The non-connection part 234 is a part of the light receiving surface 22 in the overlapping portion 200 outside the first connection part 230. It should be noted here that the area of the first connection part 230 and the area of the non-connection part 234 are different. More specifically, the area of the non-connection part 234 is larger than the area of the first connection part 230. The first film 40 and the second film 42 are provided in a manner similar to that of FIG. 7. Thus, the second variation or the fifth variation may be employed optionally so that the flexibility of structure is improved.

FIG. 10B is a partial cross-sectional view according to the sixth variation showing the vicinity of the overlapping portion 200 in FIG. 2. The description below highlights a difference from the structures discussed above. FIG. 10B represents a combination of FIG. 8A and FIG. 10A. As in FIG. 10A, the area of the second connection part 232 in the 13th solar cell 10*ac* is larger than the area of the first connection part 230 in the 12th solar cell 10*ab*. Further, as in FIG. 10A, the area of the non-connection part 234 in the 12th solar cell 10*ab* is larger than the area of the first connection part 230 in the 12th solar cell 10*ab*. Further, the light receiving surface 22 of the 12th solar cell 10*ab*, the wire 14, and the back surface 24 of the 13th solar cell 10*ac* are directly connected in the part P of the overlapping portion 200 where the first end 210 of the 12th solar cell 10*ab* or the second end 220 of the 13th solar cell 10*ac* is not provided. Thus, the third variation and the fifth variation may be combined as in the sixth variation so that the flexibility of structure is improved.

Figure 11B:
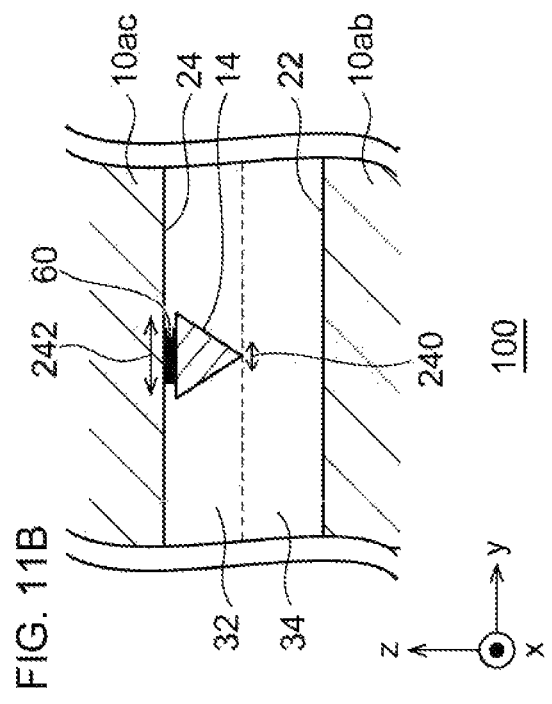
FIGS. 11A-11D are cross-sectional views showing a structure of the solar cell module of FIG. 1 according to a further variation.

The wire 14 described above extends in a cylindrical shape and has a circular cross section. The shape of the wire 14 is not limited to the described. FIGS. 11A-11D are cross-sectional views showing a structure of the solar cell module 100 according to a further variation. These figures are illustrations similar to FIG. 6B and are cross-sectional views of a part of the overlapping portion 200 where the first end 210 of the 12th solar cell 10*ab* is provided or a part of the overlapping portion 200 where the second end 220 of the 13th solar cell 10*ac* is provided. In particular, FIG. 11A is a cross-sectional view at the second end 220, FIG. 11B is a cross-sectional view at the first end 210, and the wire 14 is turned 60° in the region between. The wire 14 extends in a shape of a triangular prism and has a triangular cross section. The cross section is, for example, a regular triangle. Referring to FIG. 11A, the wire 14 is attached to the light receiving surface 22 of the 12th solar cell 10*ab* by the conductive substance 60. The wire 14 having a triangular cross section has an advantage of causing light to be incident on the solar cell 10 by allowing a large area of contact with the solar cell 10 to be secured and reflecting the incident light diagonally at the wire 14. If the wire 14 having a triangular cross section is used in a straight fashion, however, the apex of the triangle comes into contact with the back surface 24, resulting in a small area of contact. This is prevented by turning the wire 14 by 60° as shown in FIG. 11B in a part where the wire 14 is in contact with the light receiving surface 22.

The area of the surface of the wire 14 most proximate to the light receiving surface 22 of the 12th solar cell 10*ab* is illustrated as a first area 240, and the area of the surface most proximate to the back surface 24 of the 13th solar cell 10*ac* is illustrated as a second area 242. The first area 240 matches the area of the light receiving surface 22 of the 12th solar cell 10*ab* that would come into contact with the wire 14 when the light receiving surface 22 is translated toward the wire 14. Similarly, the second area 242 matches the area of the back surface 24 of the 13th solar cell 10*ac* that would come into contact with the wire 14 when the back surface 24 is translated toward the wire 14. In the case of the wire 14 having a triangular cross section, the first area 240 and the second area 242 are different. In this case, the second area 242 is smaller than the first area 240. With this structure, the first encapsulant 32 and the second encapsulant 34 are located in a larger quantity at a cell end in which the second area 242 is defined than at a cell in which the first area 240 is defined. This is equivalent to the fact that the volume of the first encapsulant 32 and the second encapsulant 34 located toward the second area 242 is larger than the volume of the first encapsulant 32 and the second encapsulant 34 located toward the first area 240.

In the case the two solar cells 10 are deformed to come into contact with the wire 14, the first area 240 on the light receiving surface 22 of the 12th solar cell 10*ab* coming into contact with the wire 14 and the second area 242 on the back surface 24 of the 13th solar cell 10ac coming into contact with the wire 14 are different. The latter is smaller than the former. Since the area of contact is smaller, the load applied to the back surface 24 of the 13th solar cell 10ac per a unit area is larger than the load applied to the light receiving surface 22 of the 12th solar cell 10ab per a unit area. However, the first encapsulant 32 and the second encapsulant 34 prevent the back surface 24 from being damaged.

Referring to FIG. 11B, the wire 14 is attached to the back surface 24 of the 13th solar cell 10c by the conductive substance 60. Referring to FIG. 11B, the wire 14 is turned 60° in the region between the second end 220 and the first end 210 so that one of the surfaces of the wire 14 is in contact with the back surface 24 of the 13th solar cell 10ac. This secures a large area of contact between the wire 14 and the 13th solar cell 10ac.

As described above, the area of the surface of the wire 14 most proximate to the light receiving surface 22 of the 12th solar cell 10ab is illustrated as the first area 240, and the area of the surface most proximate to the back surface 24 of the 13th solar cell 10ac is illustrated as the second area 242. In this case, too, the first area 240 matches the area of the light receiving surface 22 of the 12th solar cell 10ab that would come into contact with the wire 14 when the light receiving surface 22 is translated toward the wire 14. Similarly, the second area 242 matches the area of the back surface 24 of the 13th solar cell 10ac that would come into contact with the wire 14 when the back surface 24 is translated toward the wire 14. Meanwhile, the first area 240 is smaller than the second area 242. With this structure, the first encapsulant 32 and the second encapsulant 34 are located in a larger quantity at a cell end in which the first area 240 is defined than at a cell in which the second area 242 is defined. This is equivalent to the fact that the volume of the first encapsulant 32 and the second encapsulant 34 located toward the first area 240 is larger than the volume of the first encapsulant 32 and the second encapsulant 34 located toward the second area 242.

In the case the two solar cells 10 are deformed to come into contact with the wire 14, the first area 240 on the light receiving surface 22 of the 12th solar cell 10ab coming into contact with the wire 14 and the second area 242 on the back surface 24 of the 13th solar cell 10ac coming into contact with the wire 14 are different. The former is smaller than the latter. Since the area of contact is smaller, the load applied to the light receiving surface 22 of the 12th solar cell 10ab per a unit area is larger than the load applied to the back surface 24 of the 13th solar cell 10ac per a unit area. However, the first encapsulant 32 and the second encapsulant 34 prevent the light receiving surface 22 from being damaged.

Figure 11D:
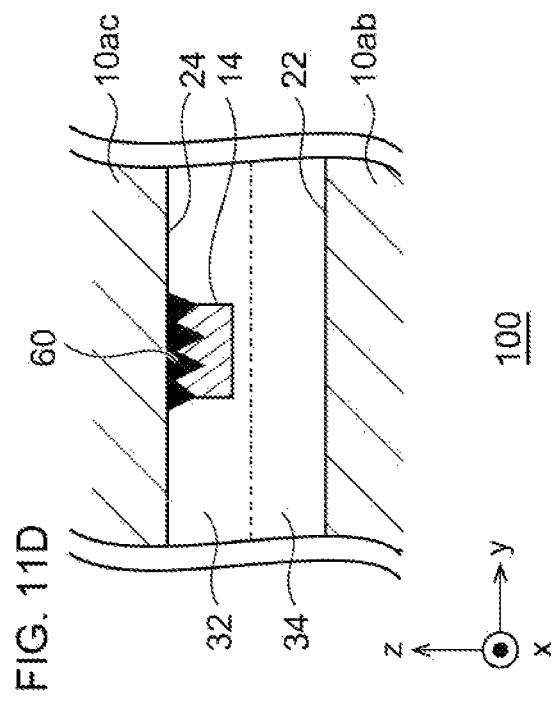
Figure 11A:
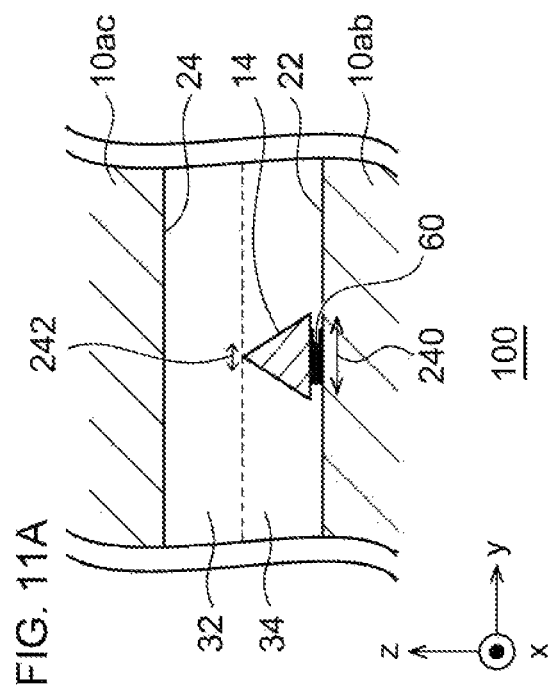
Figure 11C:
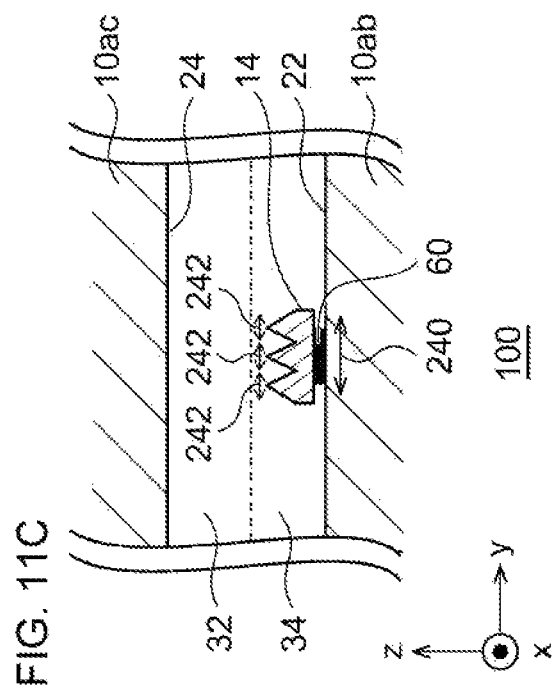

FIG. 11C shows a cross-sectional view at the second end 220, and FIG. 11D is a cross-sectional view at the first end 210. FIG. 11C shows that the shape of the wire 14 differs from the one described above. The wire 14 has a cross section provided with a plurality of convexo-concave forms. Referring to FIG. 11C, the wire 14 is attached to the light receiving surface 22 of the 12th solar cell 10ab by the conductive substance 60.

The area of the surface of the wire 14 most proximate to the light receiving surface 22 of the 12th solar cell 10ab is illustrated as the first area 240, and the area of the surface most proximate to the back surface 24 of the 13th solar cell 10ac is illustrated as the second area 242. In this case, too, the first area 240 matches the area of the light receiving surface 22 of the 12th solar cell 10ab that would come into contact with the wire 14 when the light receiving surface 22 is translated toward the wire 14. Similarly, the second area 242 matches the area of the back surface 24 of the 13th solar cell 10ac that would come into contact with the wire 14 when the back surface 24 is translated toward the wire 14. In this case, the second area 242 is smaller than the first area 240. With this structure, the first encapsulant 32 and the second encapsulant 34 are located in a larger quantity at a cell end in which the second area 242 is defined than at a cell in which the first area 240 is defined. This is equivalent to the fact that the volume of the first encapsulant 32 and the second encapsulant 34 located toward the second area 242 is larger than the volume of the first encapsulant 32 and the second encapsulant 34 located toward the first area 240.

In the case the two solar cells 10 are deformed to come into contact with the wire 14, the first area 240 on the light receiving surface 22 of the 12th solar cell 10ab coming into contact with the wire 14 and the second area 242 on the back surface 24 of the 13th solar cell 10ac coming into contact with the wire 14 are different. The latter is smaller than the former. Since the area of contact is smaller, the load applied to the back surface 24 of the 13th solar cell 10ac per a unit area is larger than the load applied to the light receiving surface 22 of the 12th solar cell 10ab per a unit area. However, the first encapsulant 32 and the second encapsulant 34 prevent the back surface 24 from being damaged.

Referring to FIG. 11D, the wire 14 is attached to the back surface 24 of the 13th solar cell 10ac by the conductive substance 60. In the structure of FIGS. 11A-11D, the storage modulus at room temperature of the first encapsulant 32 and the second encapsulant 34 located toward the smaller of the first area 240 and the second area 242 may be smaller than the storage modulus at room temperature of the first encapsulant 32 and the second encapsulant 34 located toward the larger of the areas. The conductive substance 60 may be a resin, and the storage modulus of the filler at room temperature may be smaller than the storage modulus of the conductive substance 60 at room temperature.

A description will now be given of a method of manufacturing the solar cell module 100. The wire film 90 shown in FIG. 3 is prepared to connect two adjacent solar cells 10. The string 12 is produced by layering the first film 40 of the wire film 90 on one of the two adjacent solar cells 10 and layering the second film 42 of the wire film 90 on the other of the two adjacent solar cells 10. In that process, portions of the two adjacent solar cells are configured to overlap each other. Further, the plurality of strings 12 are connected by the bridge wiring member 16. A stack is produced by layering the first protection member 30, the first encapsulant 32, the plurality of strings 12, the second encapsulant 34, and the second protection member 36 in the stated order in the positive-to-negative direction along the z axis. This is followed by a laminate cure process performed for the stack. In this process, air is drawn from the stack, and the stack is heated and pressurized so as to be integrated. In vacuum lamination in the laminate cure process, the temperature is set to about 50-140°, as mentioned before. Further, a terminal box is attached to the second protection member 36 using an adhesive.

According to this embodiment, the overlapping portion 200 includes a part where the resin is located both between the 12th solar cell 10ab and the wire 14 and between the 13th solar cell 10ac and the wire 14. Accordingly, reduction in the load bearing and the thermal cycling resistance can be inhibited. Further, the overlapping portion 200 includes a part where the resin is located both between the 12th solar cell 10ab and the wire 14 and between the 13th solar cell 10*ac* and the wire 14. Accordingly, it is possible to manufacture a paving module with improved reliability, securing the manufacturability at the same time. Further, one of the resin located between the 12th solar cell 10*ab* and the wire 14 and the resin located between the 13th solar cell 10*ac* and the wire 14 in the overlapping portion 200 has a storage modulus at room temperature of 20 MPa or lower. Accordingly, the load bearing can be maintained. Further, one of the resin located between the 12th solar cell 10*ab* and the wire 14 and the resin located between the 13th solar cell 10*ac* and the wire 14 in the overlapping portion has a gel fraction of 50% or higher. Accordingly, the crosslinkability can be maintained.

Further, the resin located between the 12th solar cell 10*ab* and the wire 14 and the resin located between the 13th solar cell 10*ac* and the wire in the overlapping portion 200 are different materials. Accordingly, a variety of resins can be used. Further, two or more types of resin are included between the 12th solar cell 10*ab* and the wire 14 in the overlapping portion 200. Accordingly, a variety of resins can be used. Further, the resin located between the 12th solar cell 10*ab* and the wire 14 and the resin located between the 13th solar cell 10*ac* and the wire 14 in the overlapping portion 200 are contiguous with each other and are crosslinked. Accordingly, reduction in the thermal cycling resistance can be inhibited. Further, the resin included between the 12th solar cell 10*ab* and the wire 14 in the overlapping portion 200 is colored in white and so can reflect the light transmitted through the solar cell 10 toward the solar cell 10. Further, since the light transmitted through the solar cell 10 is reflected toward the solar cell 10, the conversion efficiency can be improved.

Further, the part of the overlapping portion 200 where the first end 210 or the second end 220 is not provided includes a part where the 12th solar cell 10*ab*, the wire 14, and the 13th solar cell 10*ac* are directly connected. Accordingly, the electric resistance can be reduced. Further, since the electric resistance can be reduced, the conversion efficiency can be improved. Further, a gap from the resin is created at least one of between the 12th solar cell 10*ab* and the wire 14 and between the 13th solar cell 10*ac* and the wire 14. Accordingly, the stress is modified, and reduction in the load bearing and the thermal cycling resistance is inhibited. Further, the area of the connection part of the overlapping portion 200 where the 13th solar cell 10*ac* and the wire 14 are connected is larger than the area of the connection part of the overlapping portion 200 where the 12th solar cell 10*ab* and the wire 14 are connected. Accordingly, the flexibility of configuration can be improved. Further, the area of the non-connection part of the overlapping portion 200 where the 12th solar cell 10*ab* and the wire 14 are not connected is larger than the area of the connection part of the overlapping portion 200 where the 12th solar cell 10*ab* and the wire 14 are connected. Accordingly, the flexibility of configuration can be improved.

Further, the 12th solar cell 10*ab* and the wire 14 are not connected in the overlapping portion 200.

Accordingly, the freedom of movement of the wire 14 can be improved. Further, since the freedom of movement of the wire 14 can be improved, the stress applied to the 12th solar cell 10*ab* can be reduced. Further, the 13th solar cell 10*ac* and the wire 14 are not connected in the overlapping portion 200. Accordingly, the freedom of movement of the wire 14 can be improved. Further, since the freedom of movement of the wire 14 can be improved, the stress applied to the 13th solar cell 10*ac* can be reduced. Further, in the parts where the first end 210 and the second end 220 are respectively provided, the resin is located both between the 12th solar cell 10*ab* and the wire 14 and between the 13th solar cell 10*ac* and the wire 14. Accordingly, reduction in the load bearing and the thermal cycling resistance can be inhibited. Further, the volume of resin is larger than the volume of the wire 14 between the 12th solar cell 10*ab* and the 13th solar cell 10*ac* in the overlapping portion 200. Accordingly, reduction in the load bearing and the thermal cycling resistance can be inhibited.

Further, the resin is located toward the smaller of the first area and the second area. Accordingly, reduction in the load bearing and the thermal cycling resistance can be inhibited. Further, the volume of the resin located toward the smaller of the first area and the second area is larger than the volume of the resin located toward the larger of the areas. Accordingly, reduction in the load bearing and the thermal cycling resistance can be inhibited. Further, the storage modulus at room temperature of the resin located toward the smaller of the first area and the second area is smaller than the storage modulus at room temperature of the resin located toward the larger of the areas. Accordingly, reduction in the load bearing can be inhibited. Further, the angle of the wire is changed in the overlapping portion in the case the wire having a shape of a triangular prism is used in order to secure a large area of contact at the cell end. Accordingly, the load bearing can be maintained. If a wiring member that is asymmetrical front-to-back is connected without changing its angle, the area of contact of the wire 14 with the 12th solar cell 10*ab* and the area of contact of the wire 14 with the 13th solar cell 10*ac* will be different. Since the wire 14 is connected to the 12th solar cell 10*ab* and the 13th solar cell 10*ac*, maintaining the same orientation, it is easy to manufacture the solar cell module.

A summary of an embodiment of the present disclosure is given below. The solar cell module (100) according to an embodiment of the present disclosure includes: a 12th solar cell (10*ab*) including a light receiving surface (22) and a back surface (24) that face in opposite directions; a 13th solar cell (10*ac*) including a light receiving surface (22) and a back surface (24) that face in opposite directions and provided to overlap the 12th solar cell (10*ab*) in part when viewed from a side of the light receiving surface (22); and a wire (14) connected to the light receiving surface (22) of the 12th solar cell (10*ab*) and connected to the back surface (24) of the 13th solar cell (10*ac*). A portion of the light receiving surface (22) of the 12th solar cell (10*ab*) and a portion of the back surface (24) of the 13th solar cell (10*ac*) face each other in an overlapping portion (200) across the wire (14), and the overlapping portion (200) includes a part where a resin is located both between the light receiving surface (22) of the 12th solar cell (10*ab*) and the wire (14) and between the back surface (24) of the 13th solar cell (10*ac*) and the wire (14).

At least one of the resin located between the light receiving surface (22) of the 12th solar cell (10*ab*) and the wire (14) in the overlapping portion (200) and the resin located between the back surface (24) of the 13th solar cell (10*ac*) and the wire (14) in the overlapping portion (200) may have a storage modulus at room temperature of 20 MPa or lower.

At least one of the resin located between the light receiving surface (22) of the 12th solar cell (10*ab*) and the wire (14) in the overlapping portion (200) and the resin located between the back surface (24) of the 13th solar cell (10*ac*) and the wire (14) in the overlapping portion (200) may have a gel fraction of 50% or higher.

An encapsulant may be located between the back surface (24) of the 13th solar cell (10*ac*) and the wire (14) in the overlapping portion (200).

The resin located between the light receiving surface (22) of the 12th solar cell (10*ab*) and the wire (14) in the overlapping portion (200) and the resin located between the back surface (24) of the 13th solar cell (10*ac*) and the wire (14) in the overlapping portion (200) may be different materials.

Two or more types of resin may be included between the light receiving surface (22) of the 12th solar cell (10*ab*) and the wire (14) in the overlapping portion (200).

The resin located between the light receiving surface (22) of the 12th solar cell (10*ab*) and the wire (14) in the overlapping portion (200) and the resin located between the back surface (24) of the 13th solar cell (10*ac*) and the wire (14) in the overlapping portion (200) may be contiguous with each other and may be crosslinked.

The resin included between the light receiving surface (22) of the 12th solar cell (10*ab*) and the wire (14) in the overlapping portion (200) may be colored in white.

A part of the overlapping portion (200) may include a part where the 12th solar cell (10*ab*), the wire (14), and the 13th solar cell (10*ac*) are connected.

A gap from the resin may be created at least one of between the light receiving surface (22) of the 12th solar cell (10*ab*) and the wire (14) in the overlapping portion (200) and between the back surface (24) of the 13th solar cell (10*ac*) and the wire (14) in the overlapping portion (200).

An area of a connection part of the overlapping portion (200) where the back surface (24) of the 13th solar cell (10*ac*) and the wire (14) are connected may be larger than an area of a connection part of the overlapping portion (200) where the light receiving surface (22) of the 12th solar cell (10*ab*) and the wire (14) are connected.

An area of a non-connection part of the overlapping portion (200) where the light receiving surface (22) of the 12th solar cell (10*ab*) and the wire (14) are not connected is larger than an area of a part of the overlapping portion (200) where the light receiving surface (22) of the 12th solar cell (10*ab*) and the wire (14) are connected.

The light receiving surface (22) of the 12th solar cell (10*ab*) and the wire (14) may not be connected in the overlapping portion (200).

The back surface (24) of the 13th solar cell (10*ac*) and the wire (14) may not be connected in the overlapping portion (200).

The overlapping portion (200) may include a region where neither the light receiving surface (22) of the 12th solar cell (10*ab*) nor the back surface (24) of the 13th solar cell is connected to the wire (14).

In a part of the overlapping portion (200) where a first end (210) of the 12th solar cell (10*ab*) is provided, the resin may be located between the light receiving surface (22) of the 12th solar cell (10*ab*) and the wire (14), and, in a part of the overlapping portion (200) where a second end (220) of the 13th solar cell (10*ac*) is provided, the resin may be located between the back surface (24) of the 13th solar cell (10*ac*) and the wire (14).

In the overlapping portion (200), a volume of the resin may be larger than a volume of the wire (14) between the light receiving surface (22) of the 12th solar cell (10*ab*) and the back surface (24) of the 13th solar cell (10*ac*).

A first area (240) of the light receiving surface (22) of the 12th solar cell (10*ab*) that comes into contact with the wire (14) when the light receiving surface (22) is translated toward the wire (14) and a second area (242) of the back surface (24) of the 13th solar cell (10*ac*) that comes into contact with the wire (14) when the back surface (24) is translated toward the wire (14) may be different, and, in parts of the overlapping portion (200) where a first end (210) of the 12th solar cell (10*ab*) and a second end (220) of the 13th solar cell (10*ac*) are respectively provided, the resin may be located at a cell end in which the smaller of the first area (240) and the second area (242) is defined.

A first area (240) of the light receiving surface (22) of the 12th solar cell that comes into contact with the wire (14) when the light receiving surface (22) is translated toward the wire (14) and a second area (242) of the back surface (24) of the 13th solar cell (10*ac*) that comes into contact with the wire (14) when the back surface (24) is translated toward the wire (14) may be different, and, in parts of the overlapping portion (200) where a first end (210) of the 12th solar cell (10*ab*) and a second end (220) of the 13th solar cell (10*ac*) are respectively provided, a volume of the resin located at cell end in which the smaller of the first area (240) and the second area (242) is defined may be larger than a volume of the resin located at a cell end in which the larger of the first area (240) and the second area (242) is defined.

A first area (240) of the light receiving surface (22) of the 12th solar cell (10*ab*) that comes into contact with the wire (14) when the light receiving surface (22) is translated toward the wire (14) and a second area (242) of the back surface (24) of the 13th solar cell (10*ac*) that comes into contact with the wire (14) when the back surface (24) is translated toward the wire (14) may be different, and, in parts of the overlapping portion (200) where a first end (210) of the 12th solar cell (10*ab*) and a second end (220) of the 13th solar cell (10*ac*) are respectively provided, a storage modulus at room temperature of the resin at a cell end in which the smaller of the first area (240) and the second area (242) is defined may be smaller than a storage modulus at room temperature of the resin at a cell end in which the larger of the first area (240) and the second area (242) is defined.

An angle of the wire (14) at a first end (210) of the 12th solar cell (10*ab*) in the overlapping portion (200) and an angle of the wire (14) at a second end (220) of the 13th solar cell (10*ac*) in the overlapping portion (200) may be different.

An area of contact of the wire (14) with the light receiving surface (22) of the 12th solar cell (10*ab*) at a first end (210) of the 12th solar cell (10*ab*) in the overlapping portion (200) and an area of contact of the wire (14) with the back surface (24) of the 13th solar cell (10*ac*) at a second end (220) of the 13th solar cell (10*ac*) in the overlapping portion (200) may be different.

Another embodiment of the present disclosure relates to a method of manufacturing a solar cell module. The method includes: manufacturing a string that connects a 12th solar cell (10*ab*) including a light receiving surface (22) and a back surface (24) that face in opposite directions to a 13th solar cell (10*ac*) including a light receiving surface (22) and a back surface (24) that face in opposite directions and provided to overlap the 12th solar cell (10*ab*) in part when viewed from a side of the light receiving surface (22), by connecting the light receiving surface (22) of the 12th solar cell (10*ab*) and the back surface (24) of the 13th solar cell (10*ac*) with a wire (14), and sandwiching the string by a first protection member (30), a second protection member (36), a first encapsulant (32), and a second encapsulant (34), the first encapsulant (32) and the second encapsulant (34) having a storage modulus at room temperature of 20 MPa or lower and a storage modulus at 100° C. of 0.5 MPa or lower, and laminating a stack to induce a temperature of 100° C. or higher in the first encapsulant (32) and the second encapsulant (34).

Described above is an explanation based on an exemplary embodiment. The embodiment is intended to be illustrative only and it will be understood by those skilled in the art that various modifications to constituting elements and processes could be developed and that such modifications are also within the scope of the present disclosure.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module comprising:
   a first solar cell including a first surface and a second surface that face in opposite directions;
   a second solar cell including a first surface and a second surface that face in opposite directions, the second solar cell overlapping the first solar cell in part when viewed from a side of the first surface of the second solar; and
   a wiring member directly connected to the first surface of the first solar cell and directly connected to the second surface of the second solar cell, wherein
   a portion of the first surface of the first solar cell and a portion of the second surface of the second solar cell face each other across the wiring member in an overlapping portion,
   the overlapping portion includes a first part, a second part, and a third part,
   the first part of the overlapping portion includes i) one end of the first solar cell and ii) a resin disposed between the first surface of the first solar cell and the wiring member such that the second solar cell, the wiring member, the resin, and the first solar cell are disposed in the mentioned order from the first surface of the second solar cell to the second surface of the first cell in the first part of the overlapping portion,
   the second part of the overlapping portion includes i) the resin disposed between the first surface of the first solar cell and the wiring member and ii) the resin disposed between the second surface of the second solar cell and the wiring member to fully radially surround the wiring member without having the first solar cell and the second solar cell being in a direct contact with the wiring member such that the second solar cell, the resin, the wiring member, the resin, and the first solar cell are disposed in the mentioned order from the first surface of the second solar cell to the second surface of the first cell in the second part of the overlapping portion, and
   the third part of the overlapping portion includes i) one end of the second solar cell and ii) the resin disposed between the second surface of the second solar cell and the wiring member such that the second solar cell, the resin, the wiring member, and the first solar cell are disposed in the mentioned order from the first surface of the second solar cell to the second surface of the first cell in the third part of the overlapping portion.

2. The solar cell module according to claim 1, wherein at least one of the resin located between the first surface of the first solar cell and the wiring member in the overlapping portion and the resin located between the second surface of the second solar cell and the wiring member in the overlapping portion has a storage modulus at room temperature of 20 MPa or lower.

3. The solar cell module according to claim 1, wherein at least one of the resin located between the first surface of the first solar cell and the wiring member in the overlapping portion and the resin located between the second surface of the second solar cell and the wiring member in the overlapping portion has a gel fraction of 50% or higher.

4. The solar cell module according to claim 1, wherein an encapsulant is located between the second surface of the second solar cell and the wiring member in the overlapping portion, and
the second surface of the second solar cell is a back surface of the second solar cell.

5. The solar cell module according to claim 1, wherein two or more types of resin are included between the first surface of the first solar cell and the wiring member in the overlapping portion, and
the first surface of the first solar cell is a light receiving surface of the first solar cell.

6. The solar cell module according to claim 1, wherein the resin located between the first surface of the first solar cell and the wiring member in the overlapping portion and the resin located between the second surface of the second solar cell and the wiring member in the overlapping portion are contiguous with each other and are crosslinked.

7. The solar cell module according to claim 1, wherein the resin included between the first surface of the first solar cell and the wiring member in the overlapping portion is colored in white, and
the first surface of the first solar cell is a light receiving surface of the first solar cell.

8. The solar cell module according to claim 1, wherein a part of the overlapping portion includes a part where the first solar cell, the wiring member, and the second solar cell are connected.

9. The solar cell module according to claim 1, wherein a gap from the resin is created at least one of between the first surface of the first solar cell and the wiring member in the overlapping portion and between the second surface of the second solar cell and the wiring member in the overlapping portion.

10. The solar cell module according to claim 1, wherein an area of a connection part of the overlapping portion where the second surface of the second solar cell and the wiring member are connected is larger than an area of a connection part of the overlapping portion where the first surface of the first solar cell and the wiring member are connected,
the second surface of the second solar cell is a back surface of the second solar cell, and
the first surface of the first solar cell is a light receiving surface of the first solar cell.

11. The solar cell module according to claim 1, wherein an area of a non-connection part of the overlapping portion where the first surface of the first solar cell and the wiring member are not connected is larger than an area of a connection part of the overlapping portion where the first surface of the first solar cell and the wiring member are connected, and
the first surface of the first solar cell is a light receiving surface of the first solar cell.

12. The solar cell module according to claim 1, wherein
the first surface of the first solar cell and the wiring member are not connected in the overlapping portion, and
the first surface of the first solar surface is a light receiving surface of the first solar cell.

13. The solar cell according to claim 1, wherein
the overlapping portion includes a region where neither the first surface of the first solar cell nor the second surface of the second solar cell is connected to the wiring member.

14. The solar cell module according to claim 1, wherein
in a part of the overlapping portion where an end of the first solar cell is provided, the resin is located between the first surface of the first solar cell and the wiring member, and, in a part of the overlapping portion where an end of the second solar cell is provided, the resin is located between the second surface of the second solar cell and the wiring member.

15. The solar cell module according to claim 1, wherein
in the overlapping portion, a volume of the resin is larger than a volume of the wiring member between the first surface of the first solar cell and the second surface of the second solar cell.

16. The solar cell module according to claim 1, wherein
a first area of the first surface of the first solar cell that comes into contact with the wiring member when the first surface is translated toward the wiring member and a second area of the second surface of the second solar cell that comes into contact with the wiring member when the second surface is translated toward the wiring member are different, and
in parts of the overlapping portion where an end of the first solar cell and an end of the second solar cell are respectively provided, the resin is located at a cell end in which the smaller of the first area and the second area is defined.

17. The solar cell module according to claim 1, wherein
a first area of the first surface of the first solar cell that comes into contact with the wiring member when the first surface is translated toward the wiring member and a second area of the second surface of the second solar cell that comes into contact with the wiring member when the second surface is translated toward the wiring member are different, and
in parts of the overlapping portion where an end of the first solar cell and an end of the second solar cell are respectively provided, a volume of the resin located at cell end in which the smaller of the first area and the second area is defined is larger than a volume of the resin located at a cell end in which the larger of the first area and the second area is defined.

18. The solar cell module according to claim 1, wherein
a first area of the first surface of the first solar cell that comes into contact with the wiring member when the first surface is translated toward the wiring member and a second area of the second surface of the second solar cell that comes into contact with the wiring member when the second surface is translated toward the wiring member are different, and
in parts of the overlapping portion where an end of the first solar cell and an end of the second solar cell are respectively provided, a storage modulus at room temperature of the resin at a cell end in which the smaller of the first area and the second area is defined is smaller than a storage modulus at room temperature of the resin at a cell end in which the larger of the first area and the second area is defined.

19. The solar cell module according to claim 1, wherein
an angle of the wiring member at an end of the first solar cell in the overlapping portion and an angle of the wiring member at an end of the second solar cell in the overlapping portion are different.

20. The solar cell module according to claim 1, wherein
an area of contact of the wiring member with the first surface of the first solar cell at an end of the first solar cell in the overlapping portion and an area of contact of the wiring member with the second surface of the second solar cell at an end of the second solar cell in the overlapping portion are different.

21. The solar cell module according to claim 1, wherein
the first part, the second part, and the third part of the overlapping portion is disposed such that the second part is disposed between the first part and the third part of the overlapping portion.

* * * * *